(12) United States Patent
Codd et al.

(10) Patent No.: US 11,482,967 B2
(45) Date of Patent: Oct. 25, 2022

(54) CONCENTRATED SOLAR PHOTOVOLTAIC AND PHOTOTHERMAL SYSTEM

(71) Applicant: The Administrators of the Tulane Educational Fund, New Orleans, LA (US)

(72) Inventors: Daniel Codd, San Diego, CA (US); Matthew David Escarra, New Orleans, LA (US); Brian C. Riggs, Frederick, MD (US)

(73) Assignee: The Administrators of the Tulane Educational Fund, New Orleans, LA (US)

( * ) Notice: Subject to any disclaimer, the term of this patent is extended or adjusted under 35 U.S.C. 154(b) by 0 days.

(21) Appl. No.: 16/497,699

(22) PCT Filed: Feb. 26, 2018

(86) PCT No.: PCT/US2018/019782
§ 371 (c)(1),
(2) Date: Sep. 25, 2019

(87) PCT Pub. No.: WO2018/157089
PCT Pub. Date: Aug. 30, 2018

(65) Prior Publication Data
US 2020/0106386 A1 Apr. 2, 2020

Related U.S. Application Data

(60) Provisional application No. 62/463,333, filed on Feb. 24, 2017.

(51) Int. Cl.
*H02S 40/44* (2014.01)
*F24S 10/50* (2018.01)
(Continued)

(52) U.S. Cl.
CPC .............. *H02S 40/44* (2014.12); *F24S 10/50* (2018.05); *F24S 20/20* (2018.05); *F24S 23/71* (2018.05);
(Continued)

(58) Field of Classification Search
CPC .......... H02S 40/44; H02S 40/22; H02S 10/30; H02S 30/00; F24S 10/50; F24S 2070/62;
(Continued)

(56) References Cited

U.S. PATENT DOCUMENTS 5,273,911 A 12/1993 Sasaki et al.
8,772,628 B2 7/2014 Wanlass et al.
(Continued)

FOREIGN PATENT DOCUMENTS

DE 29 39 486 A1 4/1981
FR 2 432 147 A1 2/1980
(Continued)

OTHER PUBLICATIONS

PCT/US2018/019782 International Search Report and Written Opinion dated Jun. 14, 2018, 12 pp.
(Continued)

*Primary Examiner* — Michael Y Sun
(74) *Attorney, Agent, or Firm* — Lathrop GPM LLP

(57) ABSTRACT

The present invention provides a hybrid, concentrating photovoltaic-solar thermal (CPV/T) system and components thereof, and methods for converting solar energy to electricity at high efficiencies while capturing and storing solar thermal energy for later deployment.

19 Claims, 37 Drawing Sheets

(51) Int. Cl.
  *F24S 23/71* (2018.01)
  *H02S 30/00* (2014.01)
  *H02S 10/30* (2014.01)
  *H01L 31/048* (2014.01)
  *F24S 20/20* (2018.01)
  *H02S 40/22* (2014.01)
  *F24S 70/60* (2018.01)

(52) U.S. Cl.
  CPC .......... *H01L 31/0488* (2013.01); *H02S 10/30* (2014.12); *H02S 30/00* (2013.01); *F24S 70/60* (2018.05); *F24S 2070/62* (2018.05); *H02S 40/22* (2014.12); *Y02E 10/44* (2013.01); *Y02E 10/52* (2013.01); *Y02E 10/60* (2013.01); *Y02E 70/30* (2013.01)

(58) Field of Classification Search
  CPC . F24S 70/60; F24S 23/71; F24S 20/20; Y02E 70/30; Y02E 10/44; Y02E 10/52; Y02E 10/60; H01L 31/0488
  See application file for complete search history.

(56) References Cited

U.S. PATENT DOCUMENTS

| | | | |
|---|---|---|---|
| 2004/0055631 A1 | 3/2004 | Kazimierz et al. | |
| 2008/0135087 A1* | 6/2008 | Anikara | H01L 27/2481 136/246 |
| 2009/0146049 A1* | 6/2009 | Hsieh | G02B 6/0021 250/216 |
| 2011/0168234 A1 | 7/2011 | Lasich et al. | |
| 2011/0232723 A1 | 9/2011 | Ostermann | |
| 2011/0240008 A1 | 10/2011 | Kesseli et al. | |
| 2012/0097216 A1 | 4/2012 | Qinglong et al. | |
| 2012/0138047 A1* | 6/2012 | Ashkin | H01L 31/0547 126/619 |
| 2012/0174582 A1 | 7/2012 | Moussavi | |
| 2012/0186623 A1* | 7/2012 | Bulovic | H01L 27/302 136/244 |
| 2012/0273030 A1 | 11/2012 | Jee | |
| 2013/0199595 A1* | 8/2013 | Martin | H01L 31/0521 136/246 |
| 2013/0270589 A1 | 10/2013 | Kayes et al. | |
| 2013/0298557 A1 | 11/2013 | Treece et al. | |
| 2014/0083481 A1 | 3/2014 | Hebrink et al. | |
| 2014/0126062 A1* | 5/2014 | Heo | G02B 19/0042 359/591 |
| 2014/0318620 A1* | 10/2014 | Kare | H01L 31/0547 136/259 |
| 2015/0083192 A1 | 3/2015 | Nobori | |
| 2016/0322933 A1 | 11/2016 | Escher et al. | |
| 2016/0341498 A1* | 11/2016 | Lynn | C02F 1/06 |
| 2018/0138352 A1 | 5/2018 | Aiken et al. | |

FOREIGN PATENT DOCUMENTS

| | | | |
|---|---|---|---|
| FR | 2 515 169 A1 | | 4/1983 |
| JP | 02224375 A | * | 9/1990 |
| JP | 2013 245877 A | | 12/2013 |
| RU | 2 048 661 C1 | | 11/1995 |
| WO | WO 97/11321 A1 | | 3/1997 |
| WO | WO 2015/200927 A1 | | 12/2015 |

OTHER PUBLICATIONS

Jilte et al (2014) "Investigation on Convective Heat Losses from Solar Cavities under Wind Conditions," Energy Procedia, vol. 57, pp. 437-446. [Retrieved from the Internet: https://wvw.sciencedirect.com/science/article/pii/S1876610214015641].

All About Temp-Plate. Brochure [online], Paul Mueller Company, 2008, pp. 2-7, 10, 12, 14-16. [Retrieved from the Internet: http://www.gwindustrial.com/pdf/Mueller/Mueller_All_About_Temp-Plate.pdf].

U.S. Appl. No. 15/322,417, Final Office Action dated Jan. 29, 2020, 21 pp.

Australian Patent Application No. 2015279582, Examination Report dated Dec. 5, 2019, 3 pages.

European Patent Application No. 18756709.4; Extended European Search Report and Opinion dated Nov. 20, 2020; 14 pgs.

* cited by examiner

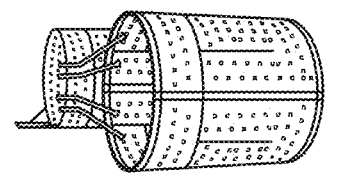
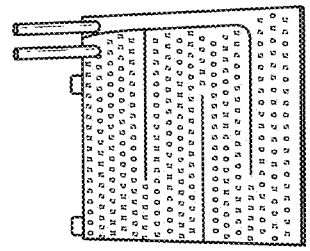
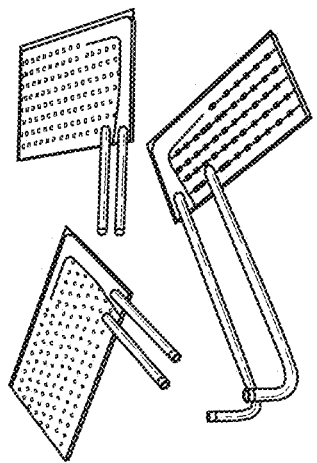
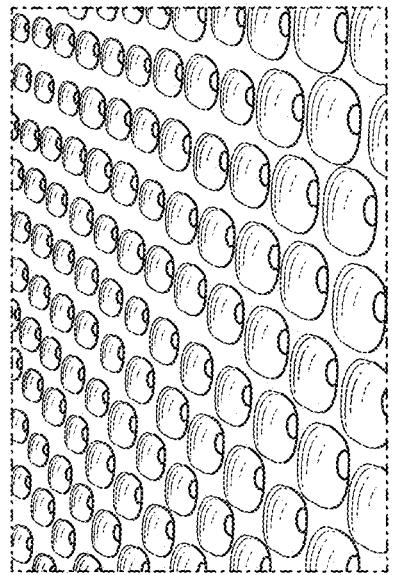
FIG. 8

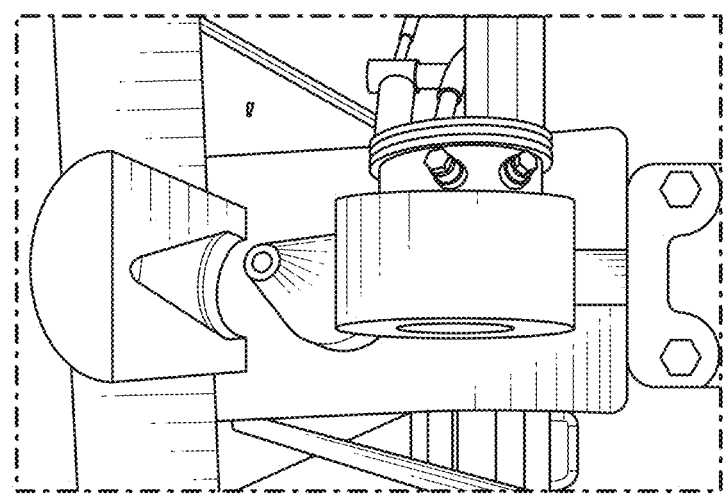
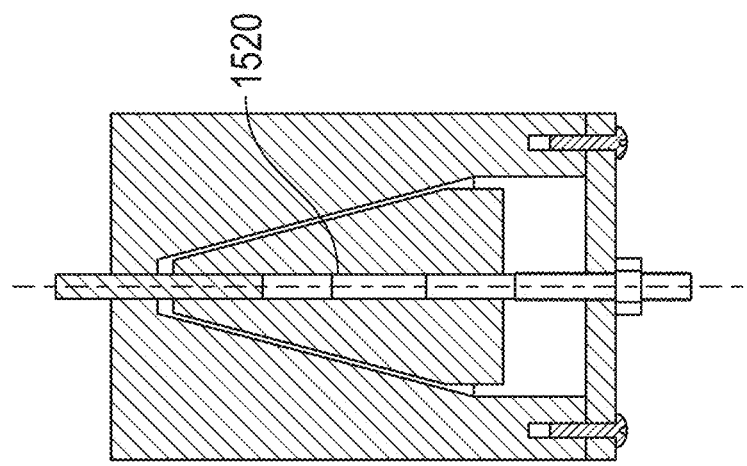
FIG. 14
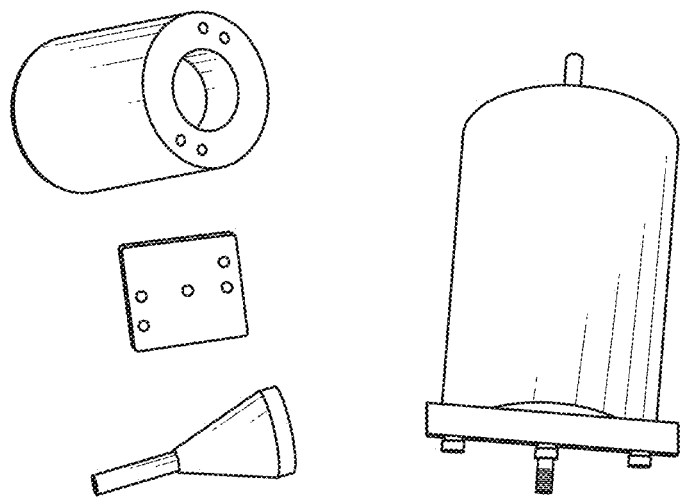

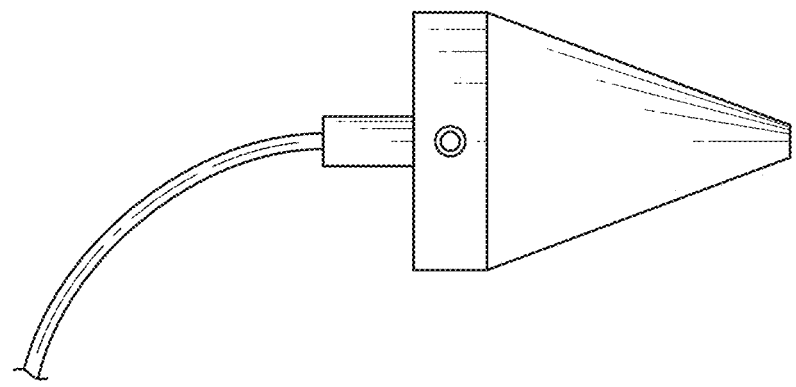
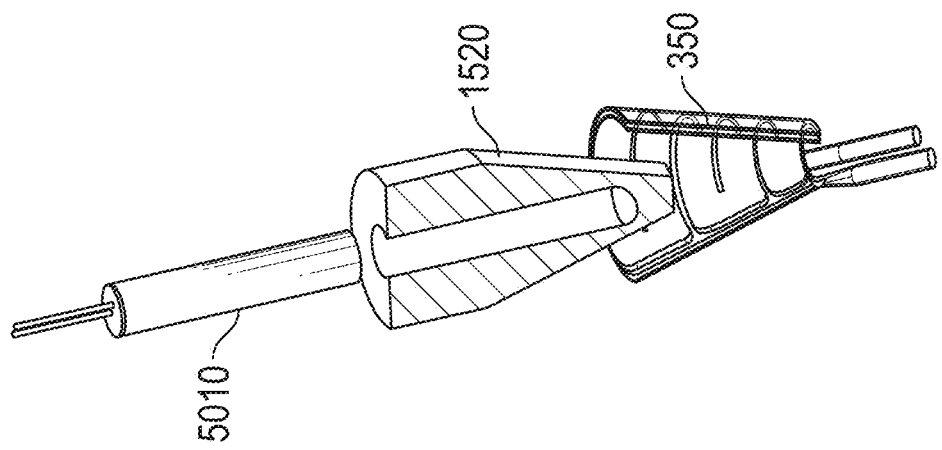
FIG. 15

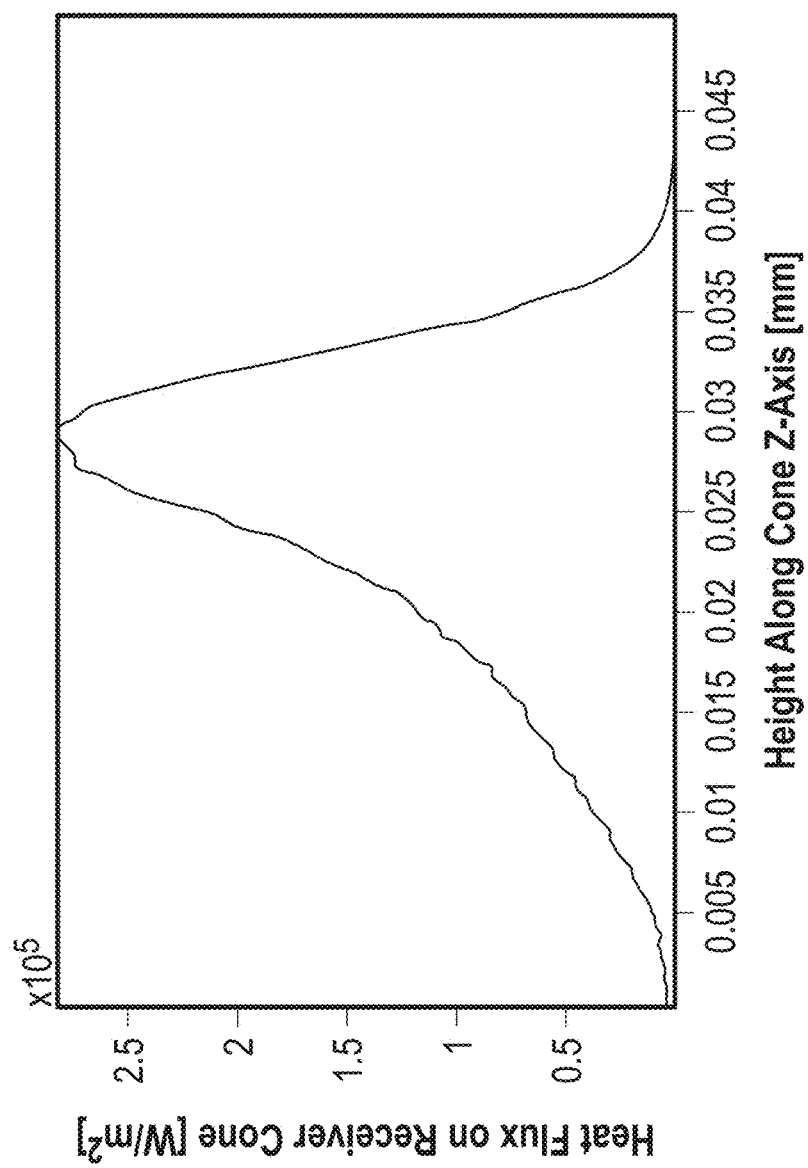
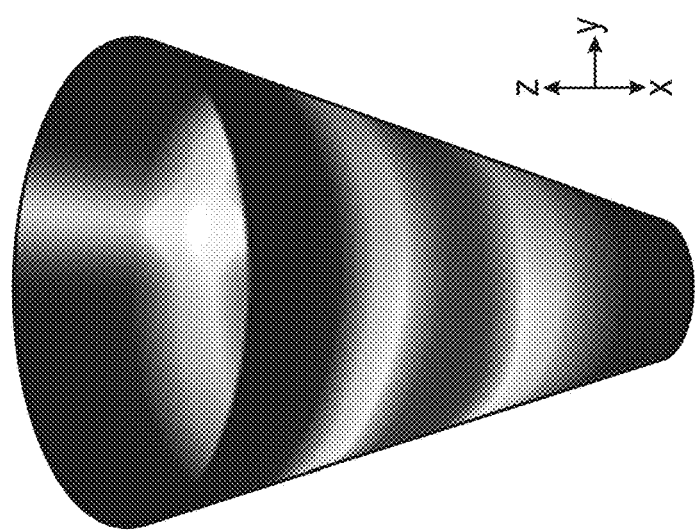
FIG. 16

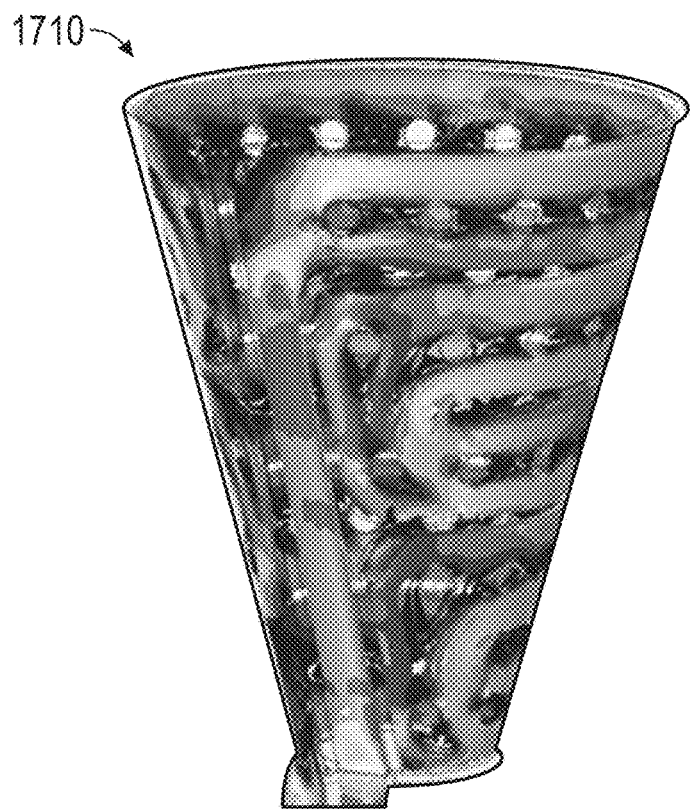
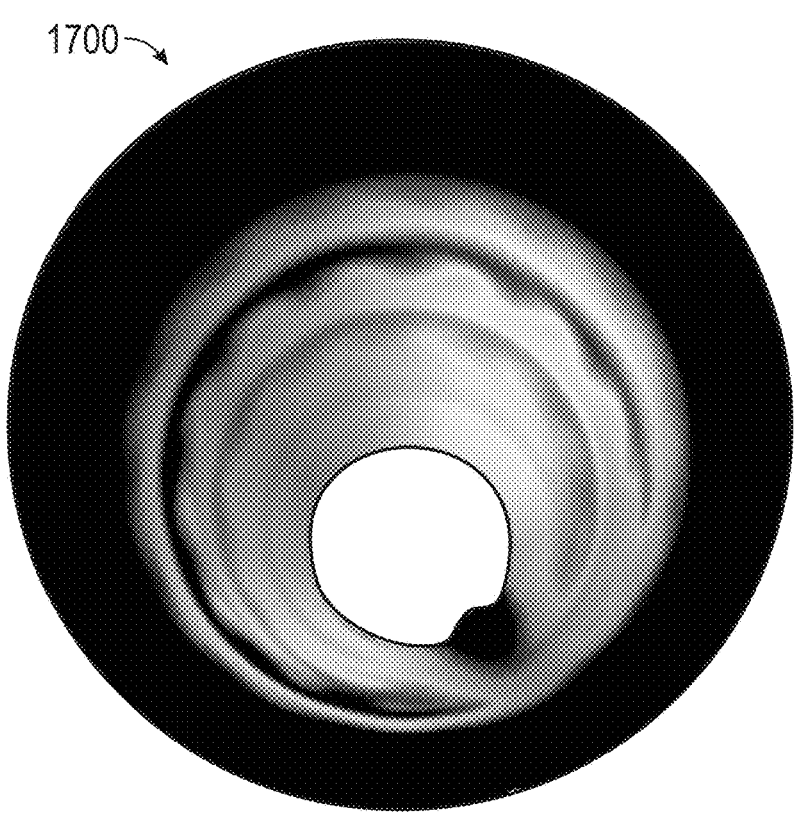
FIG. 17

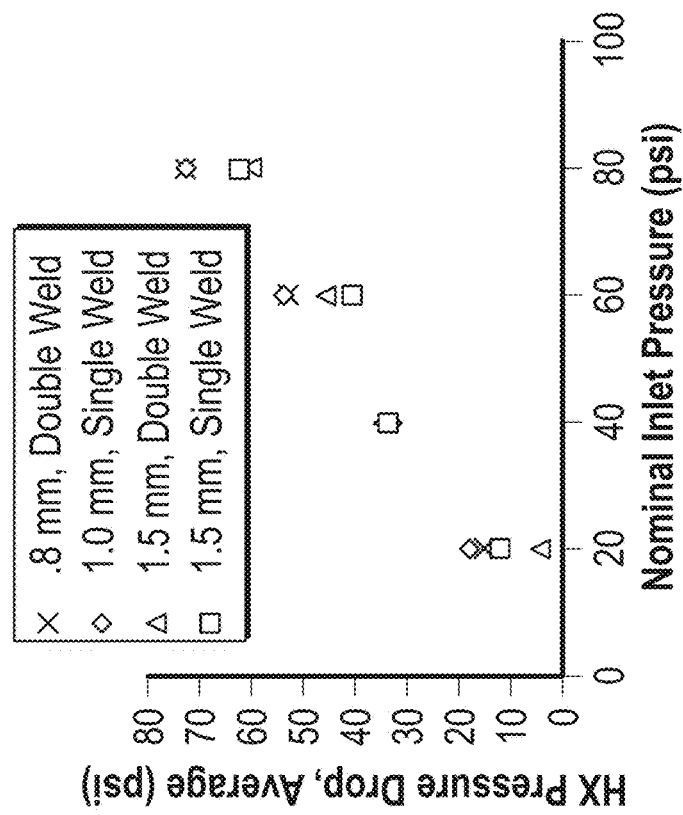
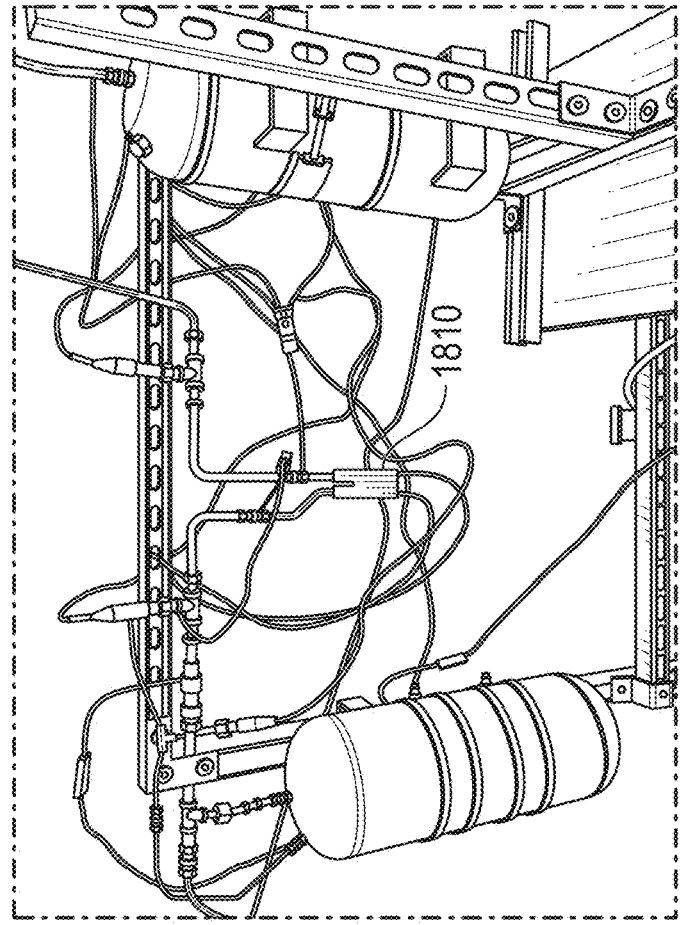
FIG. 18

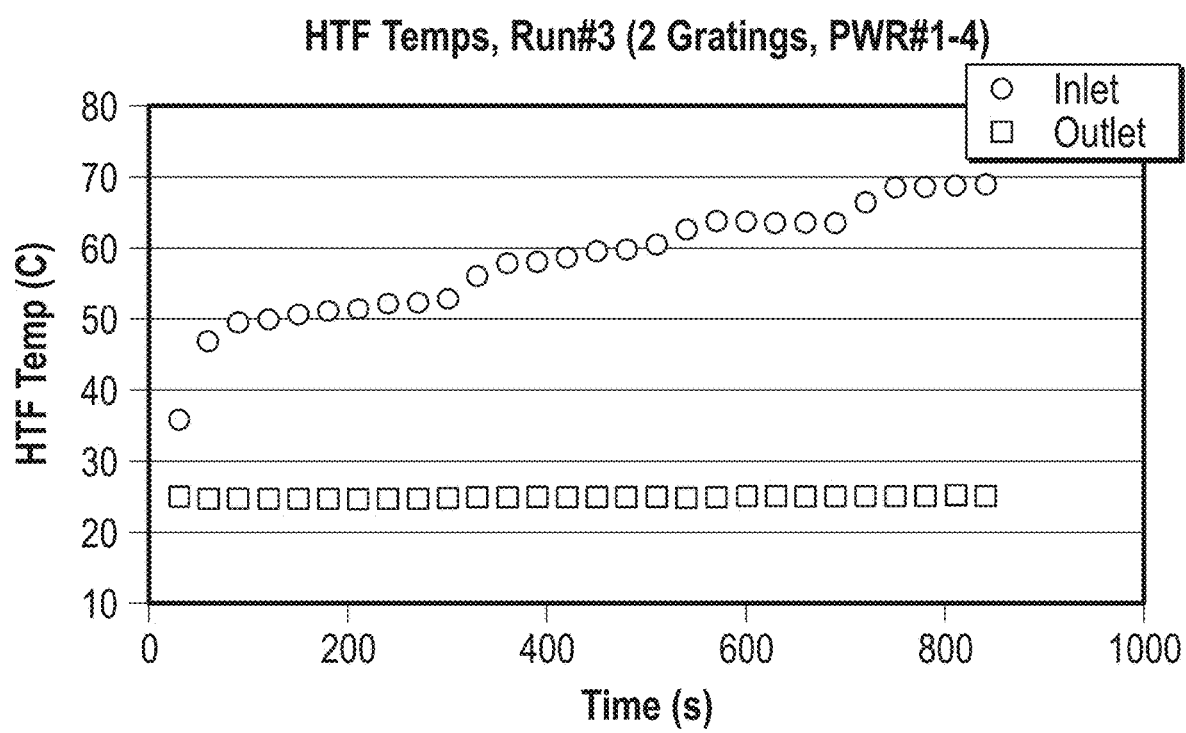
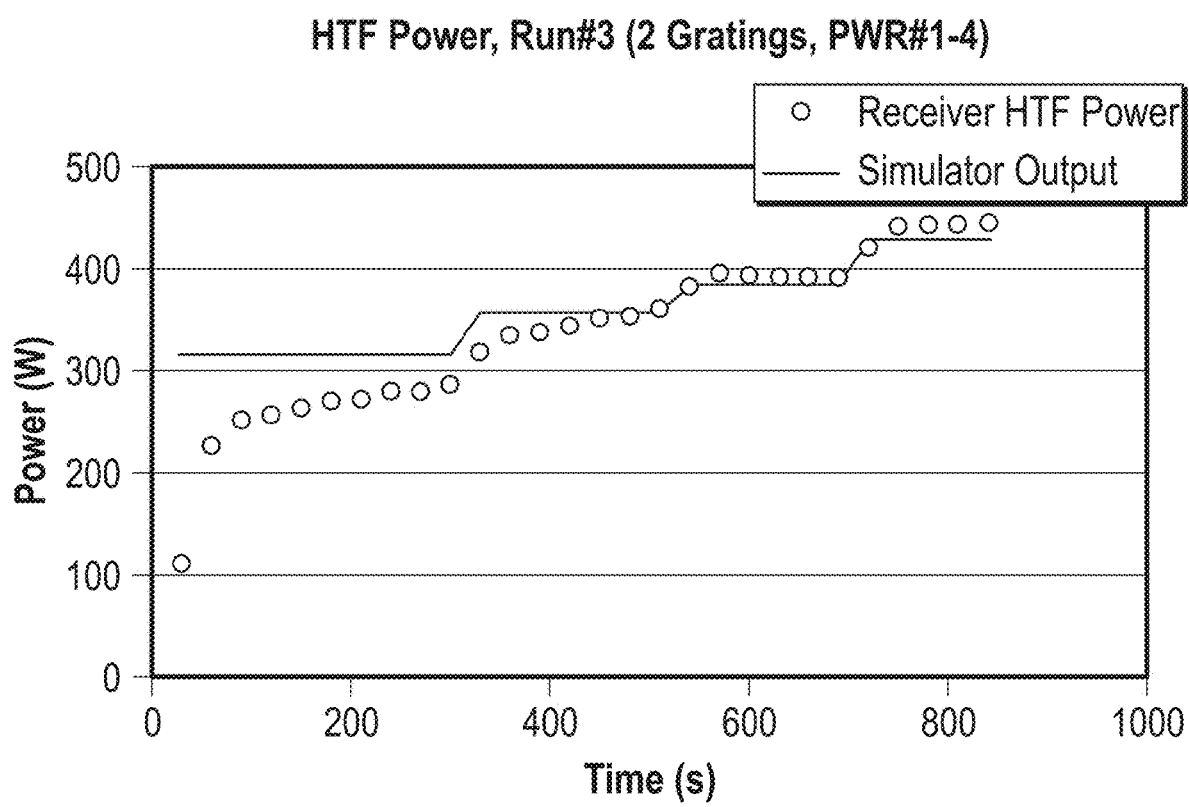
FIG. 22

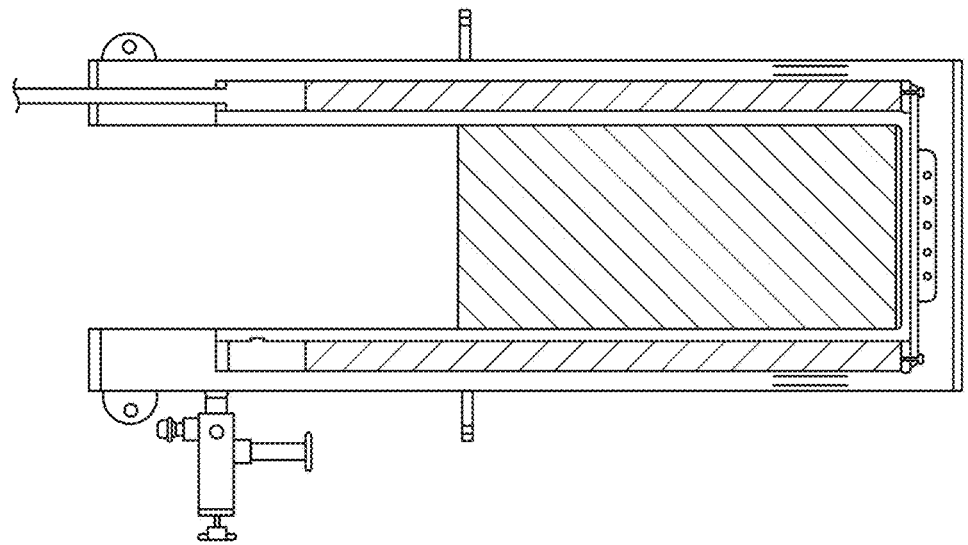
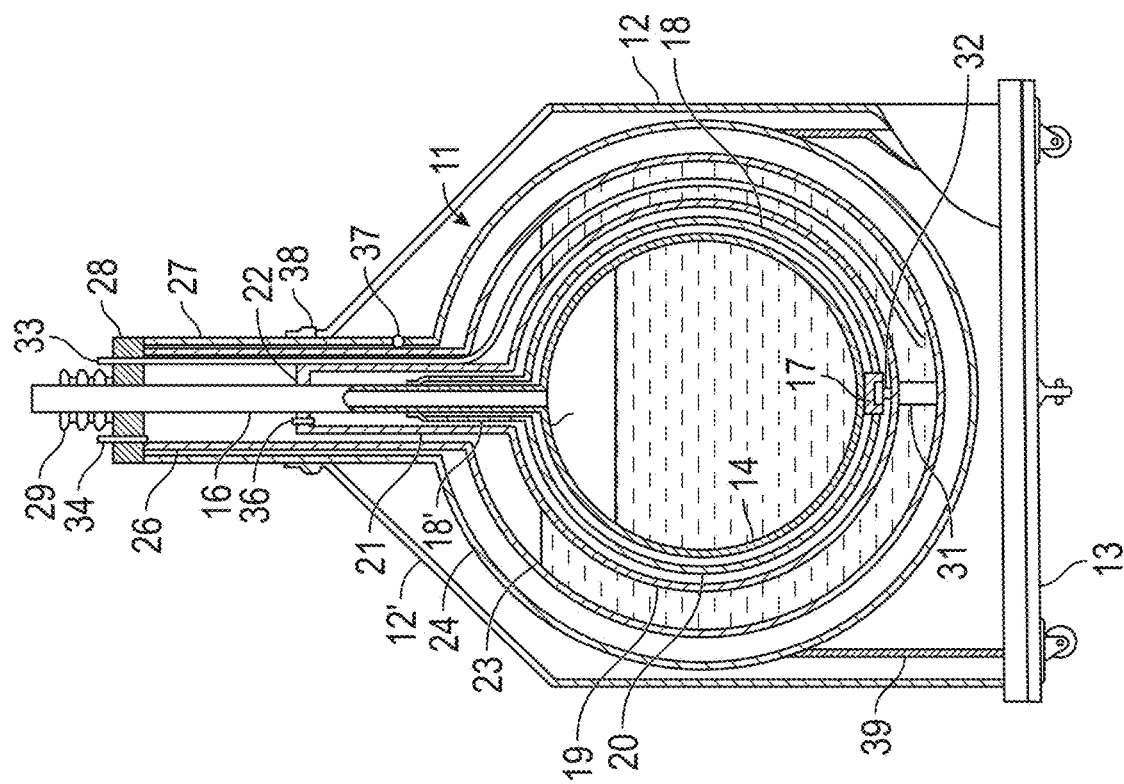
FIG. 23

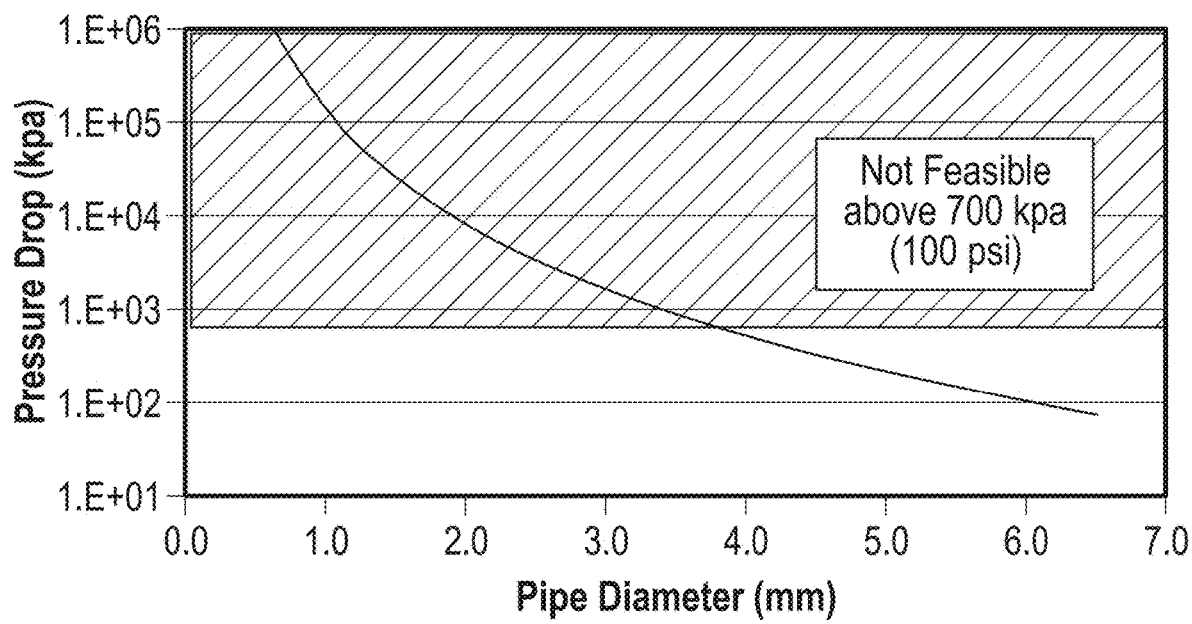
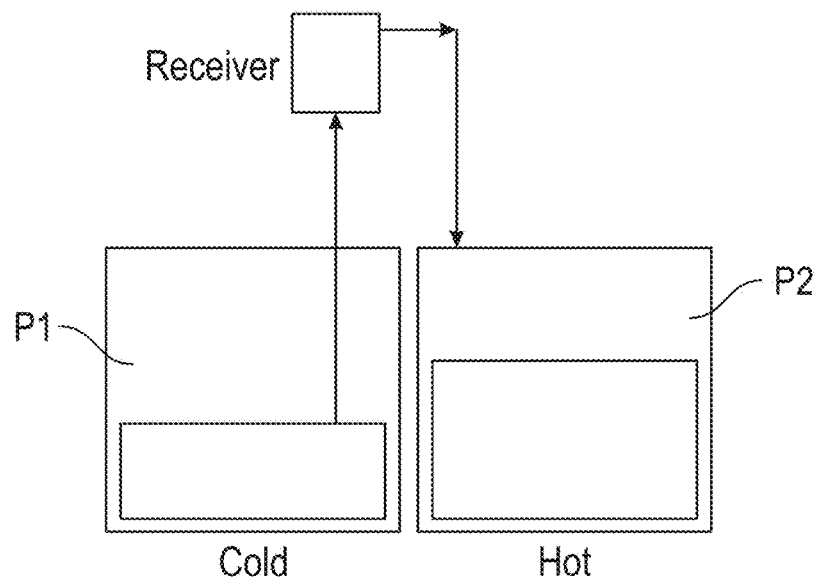
FIG. 27

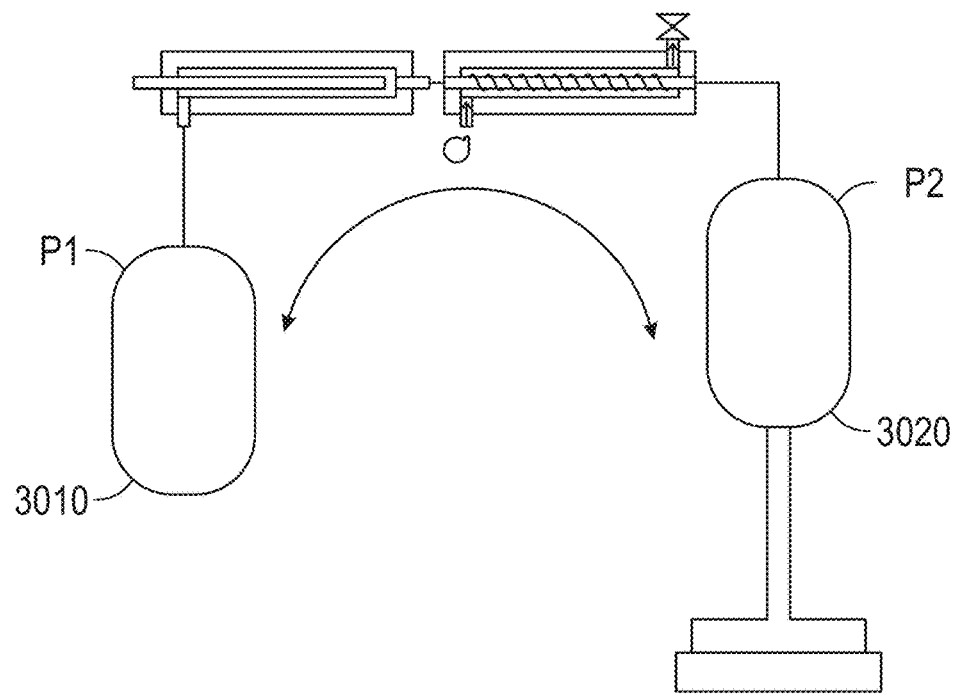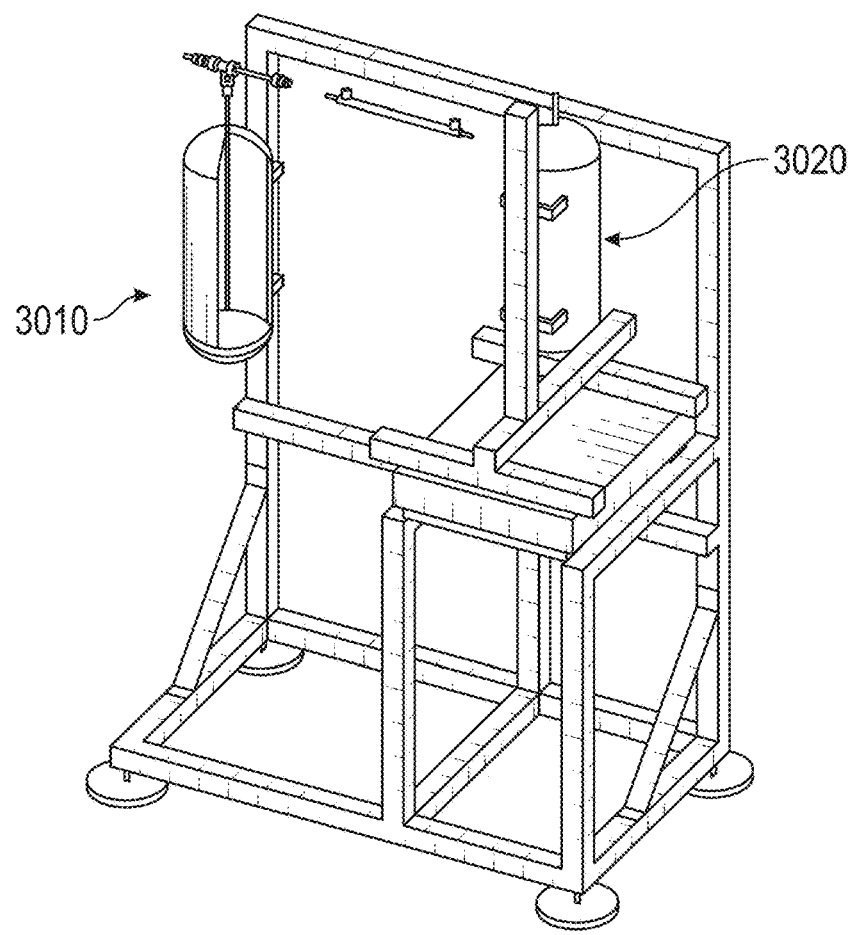
FIG. 30

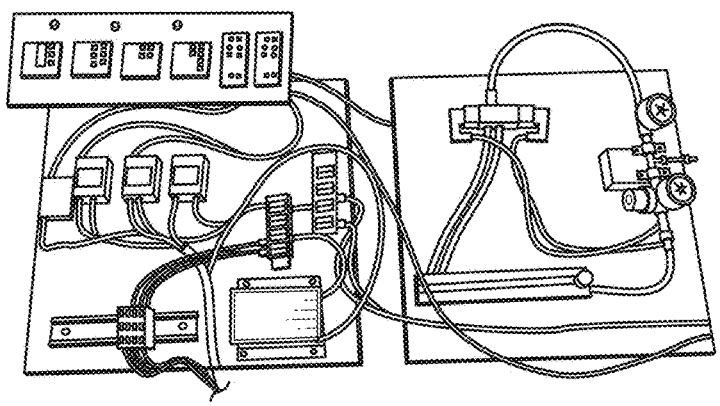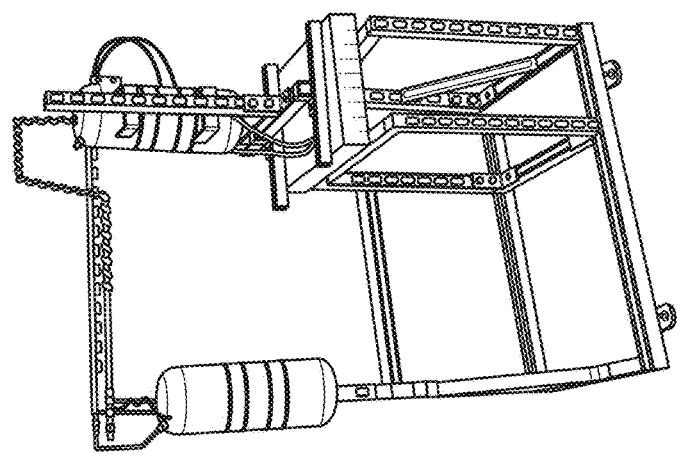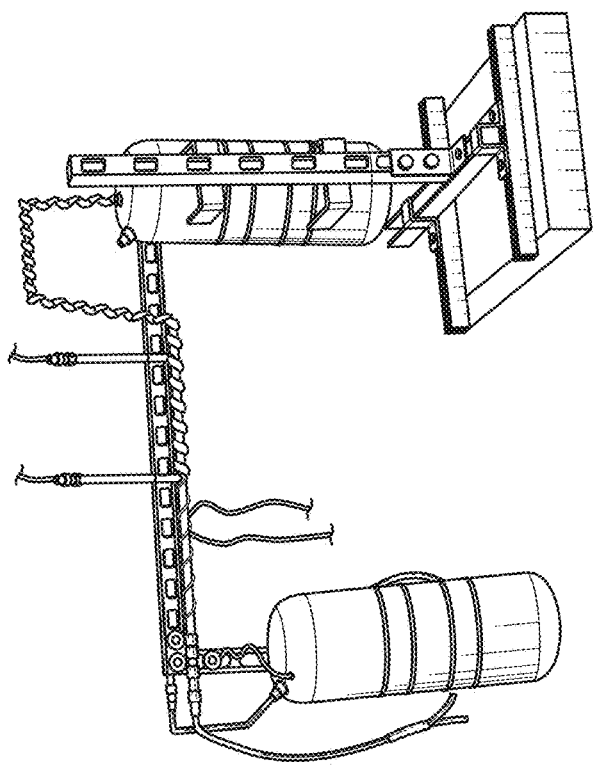
FIG. 31

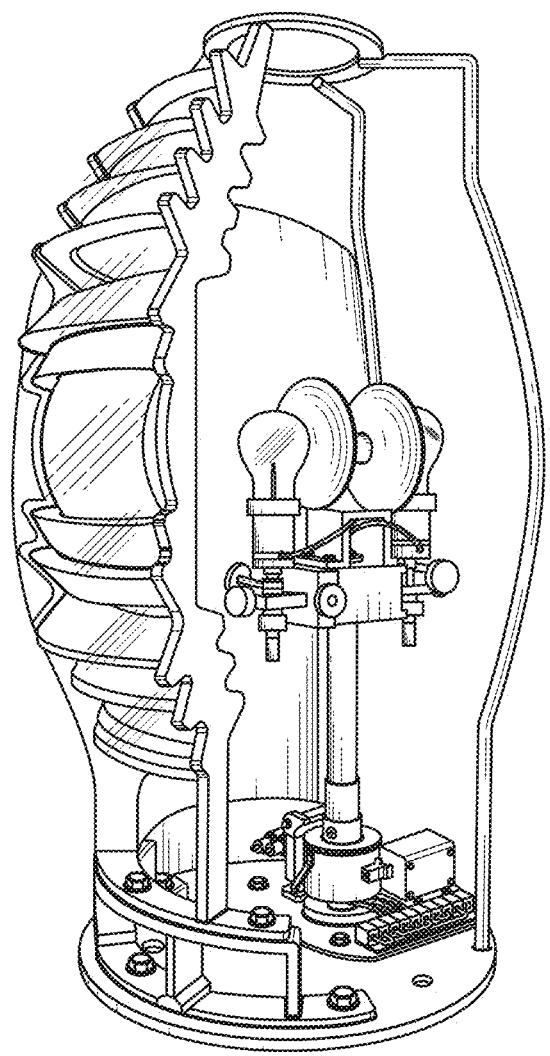
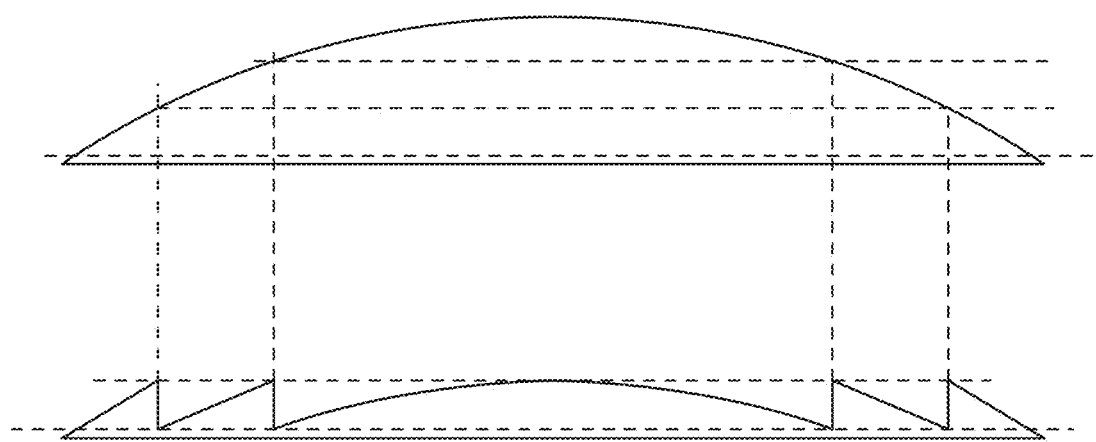
FIG. 32

CONCENTRATED SOLAR PHOTOVOLTAIC AND PHOTOTHERMAL SYSTEM

CROSS-REFERENCES TO RELATED APPLICATIONS

This application claims priority from U.S. Provisional Application No. 62/463,333, filed on Feb. 24, 2017, which is incorporated herein by reference as if set forth in full below.

STATEMENT REGARDING FEDERALLY SPONSORED RESEARCH

The invention was made with U.S. Government support from the Department of Energy and the Advanced Research Projects Agency—Energy under DOE grant no. ARPA-E DE-AR0000473. The United States Government has certain rights in the invention.

BACKGROUND OF THE INVENTION

I. Field

The present invention relates to device and methods for converting solar energy to electricity at high efficiencies while capturing and storing solar thermal energy.

II. Background

As a promising renewable energy, solar power has gained increasing attention from worldwide researchers during recent years. From photovoltaic (PV) solar cells to concentrating solar thermal (a.k.a. concentrating solar power—CSP), various solar technologies have been applied in order to most efficiently utilize the sun as an energy resource. Combining photoelectric and photothermal conversion processes via hybrid PV and solar thermal (PV/T) systems is a promising way to optimally utilize the full solar spectrum to generate electricity and heat energy with very high efficiency. The PV cells, typically the most expensive component in the system, may be utilized in a much more economical way by employing concentrating approaches to reduce the PV area required to convert a given amount of solar power to electricity, gaining improved efficiency in the process.

PV/T systems without concentrating approaches generate a relatively low working temperature—typically less than 100° C.—and have been widely investigated. However, concentrating PV (CPV)—solar thermal (CPV/T) systems face a number of challenges, including a need to maintain reasonably low cell temperatures at typically less than 110° C. and non-uniform irradiance. Studies have been done on CPV/T systems to investigate a variety of applications and effects, such as solar cooling, spectrum splitting, and thermoelectric conversion. It has been shown that the PV cells may act as heat absorbers in a hybrid CPV/T system for commercial use. Higher operating temperature CPV modules have been investigated to allow the system to operate at higher temperature. The influence of irradiance and temperature on CPV cells has been studied to find the optimal parameters of a CPV module. In many cases, efficiency and performance is limited by either inefficient spectrum splitting or a mismatch between the need to keep cell temperatures low (for efficiency and reliability purposes) while allowing high thermal output temperatures (for maximizing thermal exergy and meeting the needs of higher temperature applications).

The present invention relates to a hybrid concentrating photovoltaic-solar thermal (CPV/T) system and components thereof, and methods for converting solar energy to electricity at high efficiencies while capturing and storing solar thermal energy.

While certain novel features of this invention shown and described below are pointed out in the annexed claims, the invention is not intended to be limited to the details specified, since a person of ordinary skill in the relevant art will understand that various omissions, modifications, substitutions and changes in the forms and details of the invention illustrated and in its operation may be made without departing in any way from the spirit of the present invention. No feature of the invention is critical or essential unless it is expressly stated as being "critical" or "essential."

SUMMARY OF THE INVENTION

In one embodiment the present invention provides a thermal receiver comprising a shaped thermoplate, said shaped thermoplate further comprising: an exterior surface and an interior surface; an interior cavity, wherein said cavity is at least partially surrounded by said shaped thermoplate; a structured channel operable to receive and circulate a heat transfer fluid; an inlet port connected to said structured channel and operable to receive said heat transfer fluid into said structured channel; an outlet port connected to said structured channel and operable to discharge said heat transfer fluid from said structured channel; and a receiving aperture, wherein said receiving aperture is operable to allow concentrated solar radiation to enter said interior cavity and contact said interior surface of said shaped thermoplate.

The present invention also provides a solar energy collection system, comprising: a solar concentrator having a focal point; a photovoltaic module having a first side and a second side, wherein said first side faces toward said concentrator and said second side faces away from said concentrator, wherein said photovoltaic module is located at said focal point, and wherein said photovoltaic module is at least partially transparent to infrared light; a thermal receiver, wherein said thermal receiver is located on said second side of said photovoltaic module; and an insulating board located between said photovoltaic module and said thermal receiver, wherein said insulating board is configured to allow light passing through said photovoltaic module to enter said thermal receiver, and wherein said insulating board is operable to thermally isolate said photovoltaic module from said thermal receiver.

In an embodiment of the present invention, the module cooling system and tCPV module used in the system are those disclosed in U.S. Provisional Patent Application No. 62/314,230 filed on Mar. 28, 2016. In a preferred embodiment the concentrated photovoltaic device use in the system is the device disclosed in PCT Application No. US15/38396 filed on Jun. 29, 2015. Both of these applications are incorporated herein by reference.

BRIEF DESCRIPTION OF THE DRAWINGS

The following drawings form part of the present specification and are included to further demonstrate certain aspects of the present invention. The invention may be better understood by reference to one or more of these drawings in combination with the description of specific embodiments presented herein.

FIG. 8 shows commercial examples of dimple plate formed heat exchangers.

FIG. 14 shows a thermal receiver forming and inflation tooling.

FIG. 15 shows a thermal receiver heating insert; as fabricated with 500 W cartridge heater.

FIG. 16 shows a heat flux profile on thermal receiver from a i m$^2$ dish after passing through PV system. The graph shows the z-axis (axial direction) projection of the profile.

FIG. 17 shows (a) velocity and (b) temperature profiles of the dimpled horizontal flow case with water HTF. The peak inner conical surface temperature of this design is 223° C.

FIG. 18 shows (L) receiver testing in the USD flow loop; (R) receiver pressure drop vs. nominal tank inlet pressure.

FIG. 22 shows the conical receiver HTF temperature and extracted power for various solar simulator power levels.

FIG. 23 shows liquid helium concentric vMLI tank designs; (L) early patent [Chamberlain, 1964]; and (R) commercial bucket dewar.

FIG. 27 shows the pneumatic HTF pumping concept: (L) pressure requirements as a function of HTF piping size, and (R) conceptual schematic.

FIG. 30 shows molten salt pneumatic pumping experimental schematics.

FIG. 31 shows a molten salt pneumatic pumping experimental apparatus (prior to installation of ceramic fiber insulation).

FIG. 32 shows A) an image of a Fresnel lens used in a lamp; and B): an image of how a lens (top) can be divided into several facets arranged on a plane of a constant thickness.

DETAILED DESCRIPTION OF THE INVENTION

Detailed descriptions of one or more preferred embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in any appropriate manner.

Wherever any of the phrases "for example," "such as," "including" and the like are used herein, the phrase "and without limitation" is understood to follow unless explicitly stated otherwise. Similarly "an example," "exemplary" and the like are understood to be non-limiting.

The term "substantially" allows for deviations from the descriptor that do not negatively impact the intended purpose. Descriptive terms are understood to be modified by the term "substantially" even if the word "substantially" is not explicitly recited. Therefore, for example, the phrase "wherein the lever extends vertically" means "wherein the lever extends substantially vertically" so long as a precise vertical arrangement is not necessary for the lever to perform its function.

The terms "comprising" and "including" and "having" and "involving" (and similarly "comprises", "includes," "has," and "involves") and the like are used interchangeably and have the same meaning. Specifically, each of the terms is defined consistent with the common United States patent law definition of "comprising" and is therefore interpreted to be an open term meaning "at least the following," and is also interpreted not to exclude additional features, limitations, aspects, etc. Thus, for example, "a process involving steps a, b, and c" means that the process includes at least steps a, b and c. Wherever the terms "a" or "an" are used, "one or more" is understood, unless such interpretation is nonsensical in context.

Figure 1:
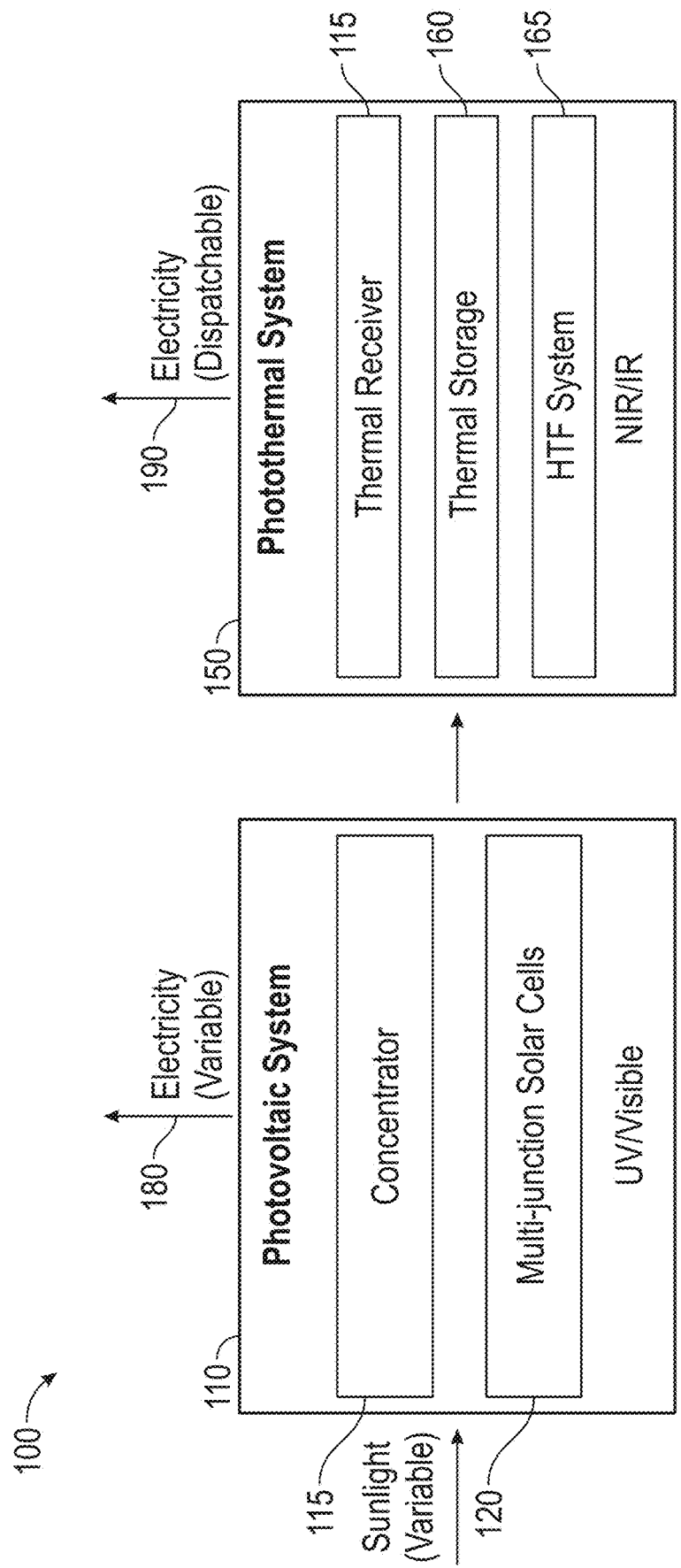
FIG. 1 shows a schematic diagram of the tCPV-based PV/T system.

In one embodiment, the hybrid system may be principally composed of the photovoltaic (PV) sub-system 110 and the solar thermal sub-system 150, as illustrated in FIG. 1. The PV sub system contains the concentrator 115 and the multi-junction solar cells 120 and absorbs incoming photons with energy above the lowest bandgap of the solar cells (mainly UV and visible light) only to directly generate variable electric power. The solar thermal sub-system 150 contains the thermal receiver 155 and the HTF system 165, and may include thermal storage system 160. Solar thermal sub-system 150 captures the transmitted photons with energy lower than the lowest solar cell bandgap (mainly IR light) and converts the captured photons to dispatchable thermal power. This thermal power may be converted to electricity by a suitable heat engine or used directly for process heat applications. The hybrid system splits the solar spectrum and utilizes it in two different sub-systems. The multi-junction solar cells 120 in the PV sub-system 110 most efficiently convert high energy photons to electricity, as the $V_{oc}$-bandgap offset ($W_{oc}$) is somewhat independent of bandgap. The thermal system 150 is less sensitive to incoming photon energy and is more efficient at utilizing IR photons.

Figure 2:
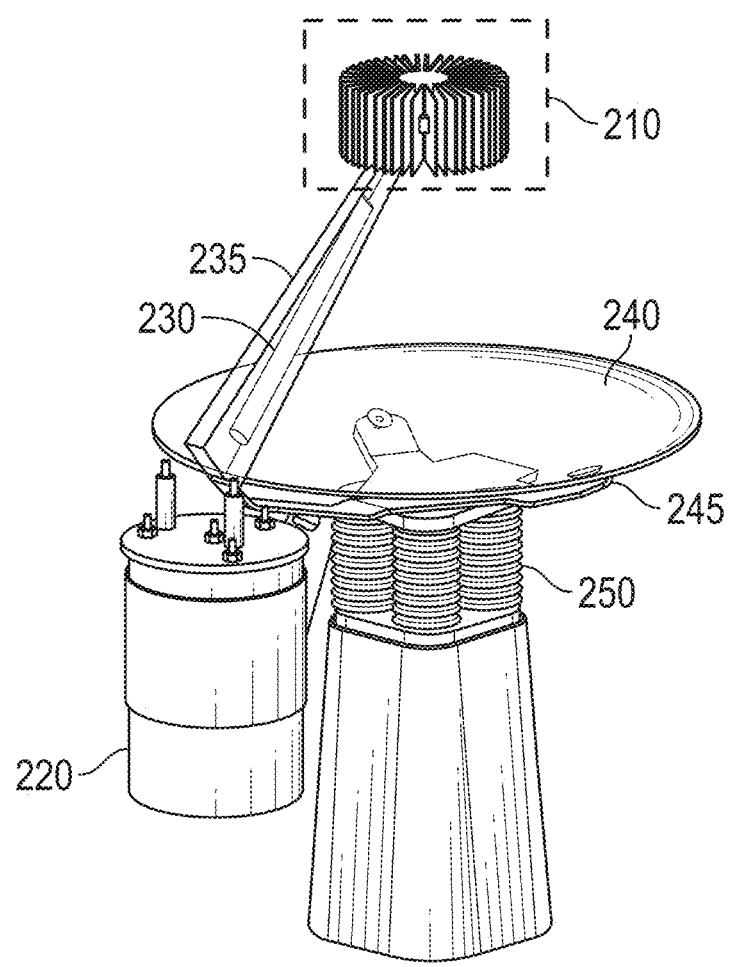
FIG. 2 shows a 3-D model of the PV/T system.

The specific design of one embodiment of a tCPV-based PV/T system may be seen in the 3-D CAD drawing shown in FIG. 2. The PV module with thermal receiver 210 is marked with a black line. Heat is conducted from the thermal receiver 155 to the thermal energy storage (TES) tank 220 through a HTF piping system 230. A parabolic dish 240 concentrates the incident light onto the transmissive PV and thermal receiver 210, dramatically increasing illumination intensity on the solar cells, enhancing efficiency, and reducing cell cost. A simple, low-cost, and effective bellows-based actuator 250 may be used as a two-axis solar tracking system to allow the system to receive maximum irradiation throughout the day and the changing seasons.

Figure 3:
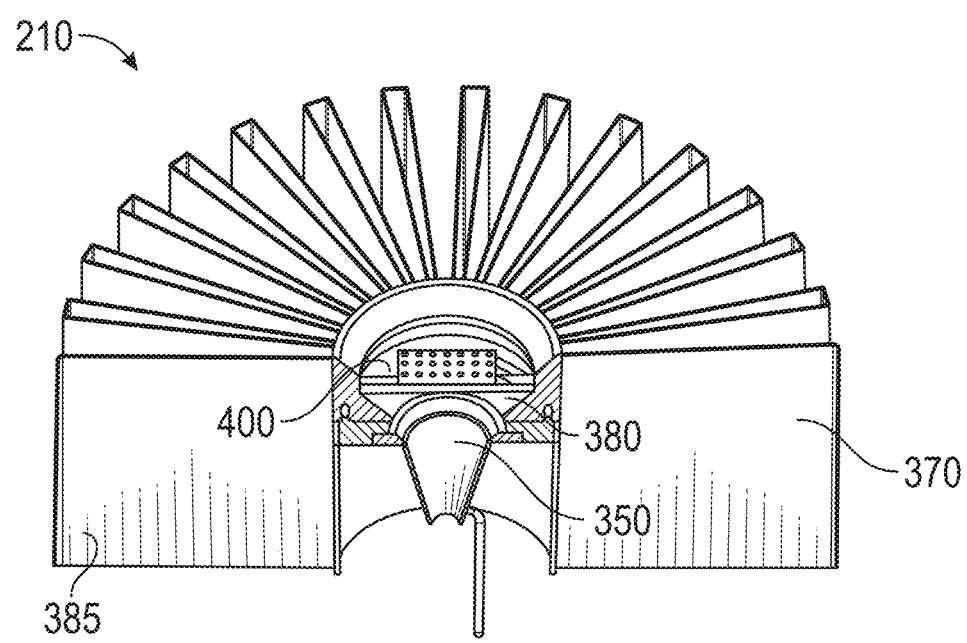
FIG. 3 shows a 3-D cross-sectional view of the tCPV module integrated with the thermal receiver.
Figure 4:
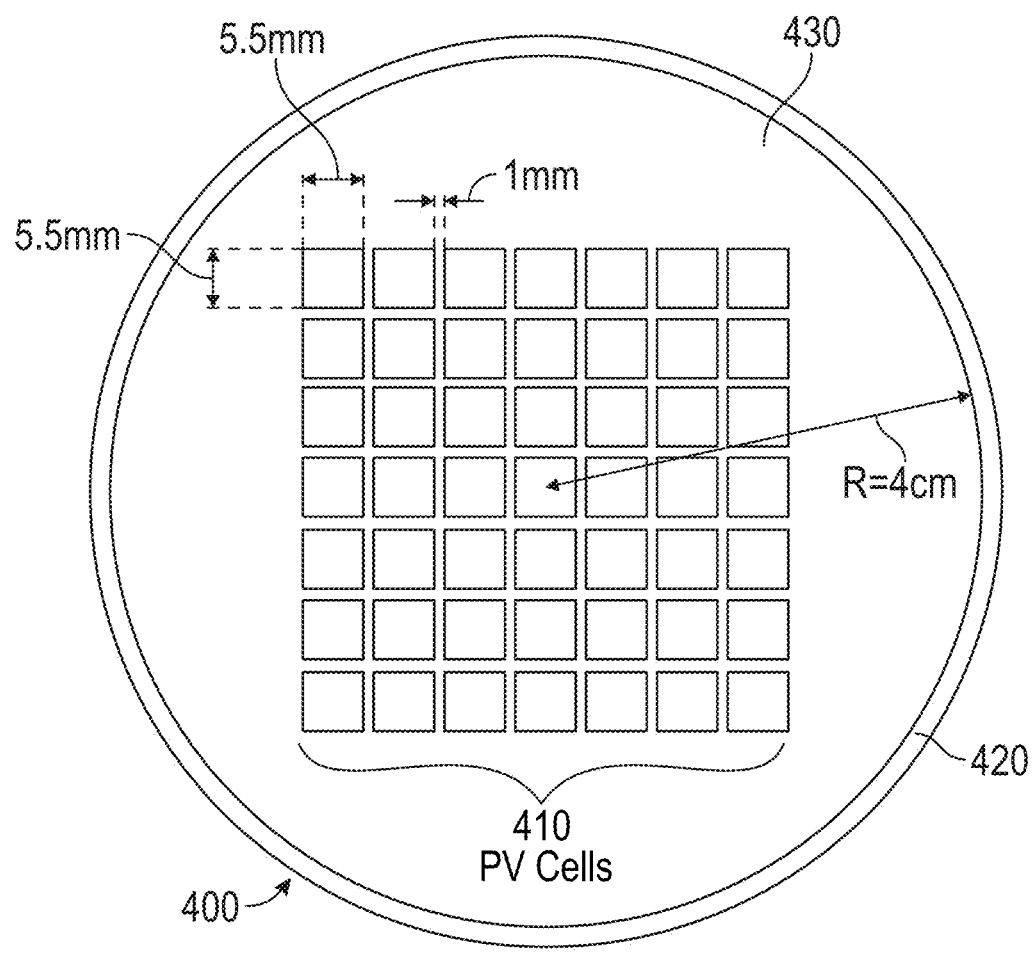
FIG. 4 shows a planar view of the tCPV module.
Figure 5:
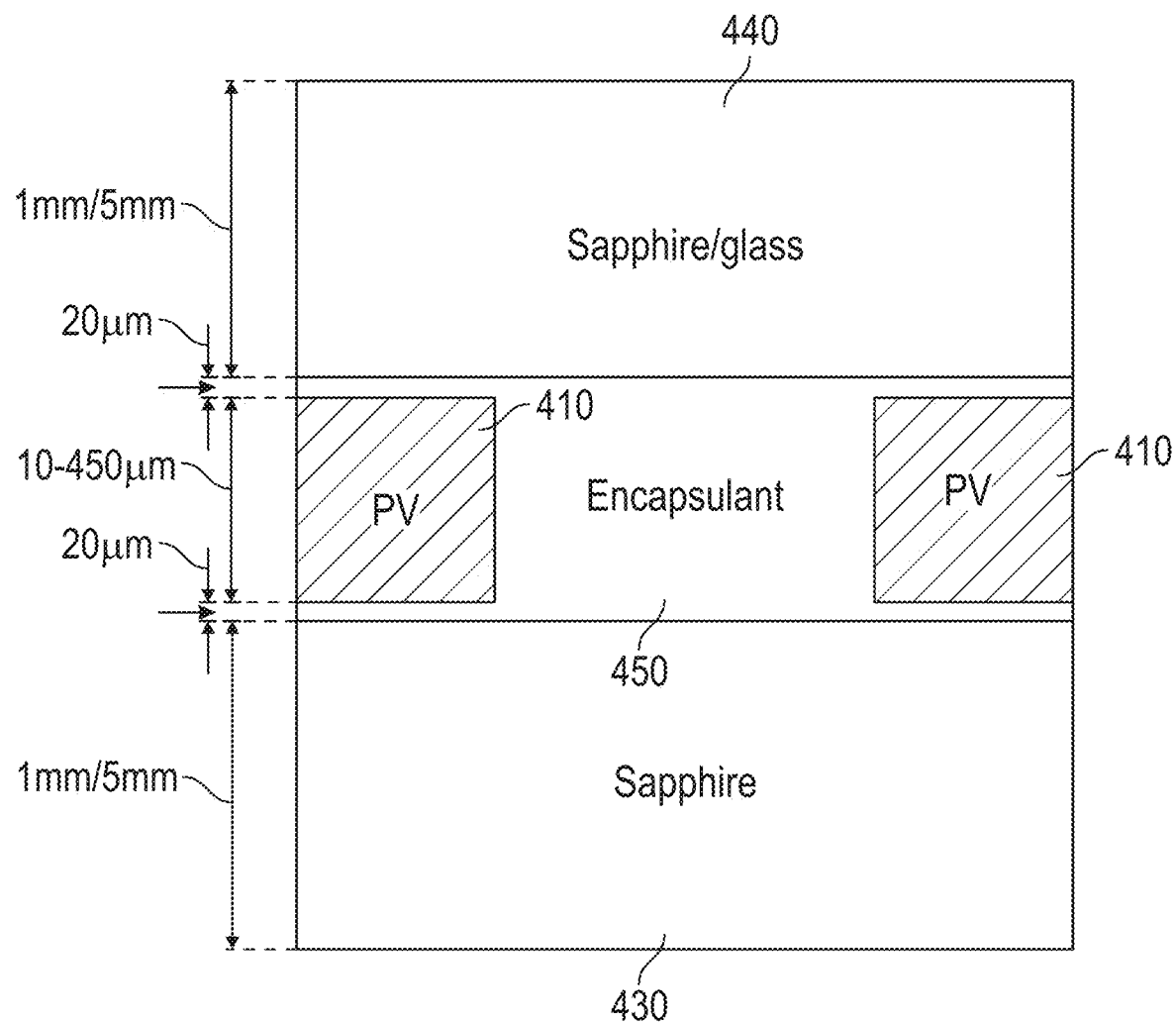
FIG. 5 shows a cross-sectional view of the tCPV module.
Figure 6:
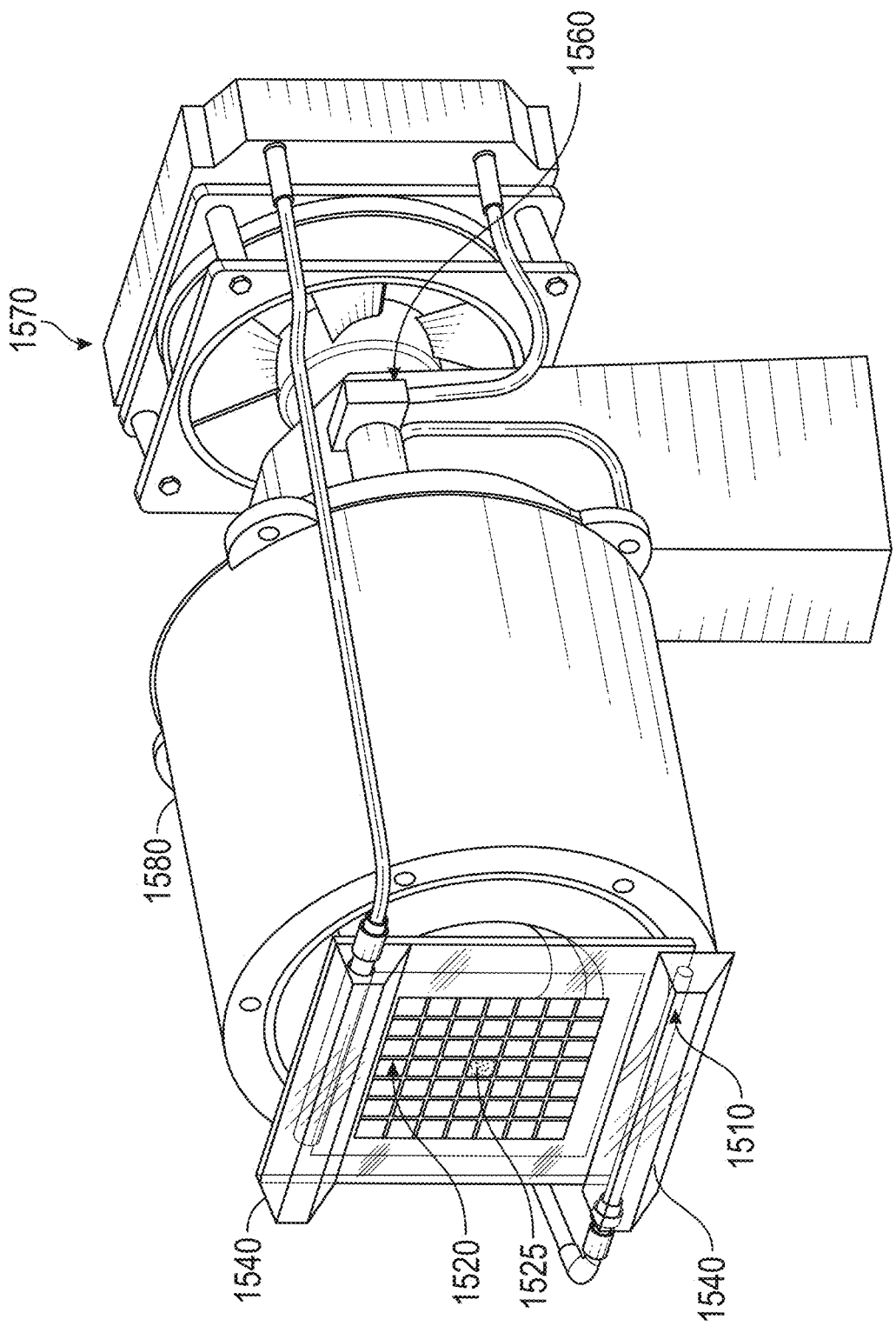
FIG. 6 shows one embodiment of the thermal receiver connected to a tCPV module with a cooling system.
Figure 7:
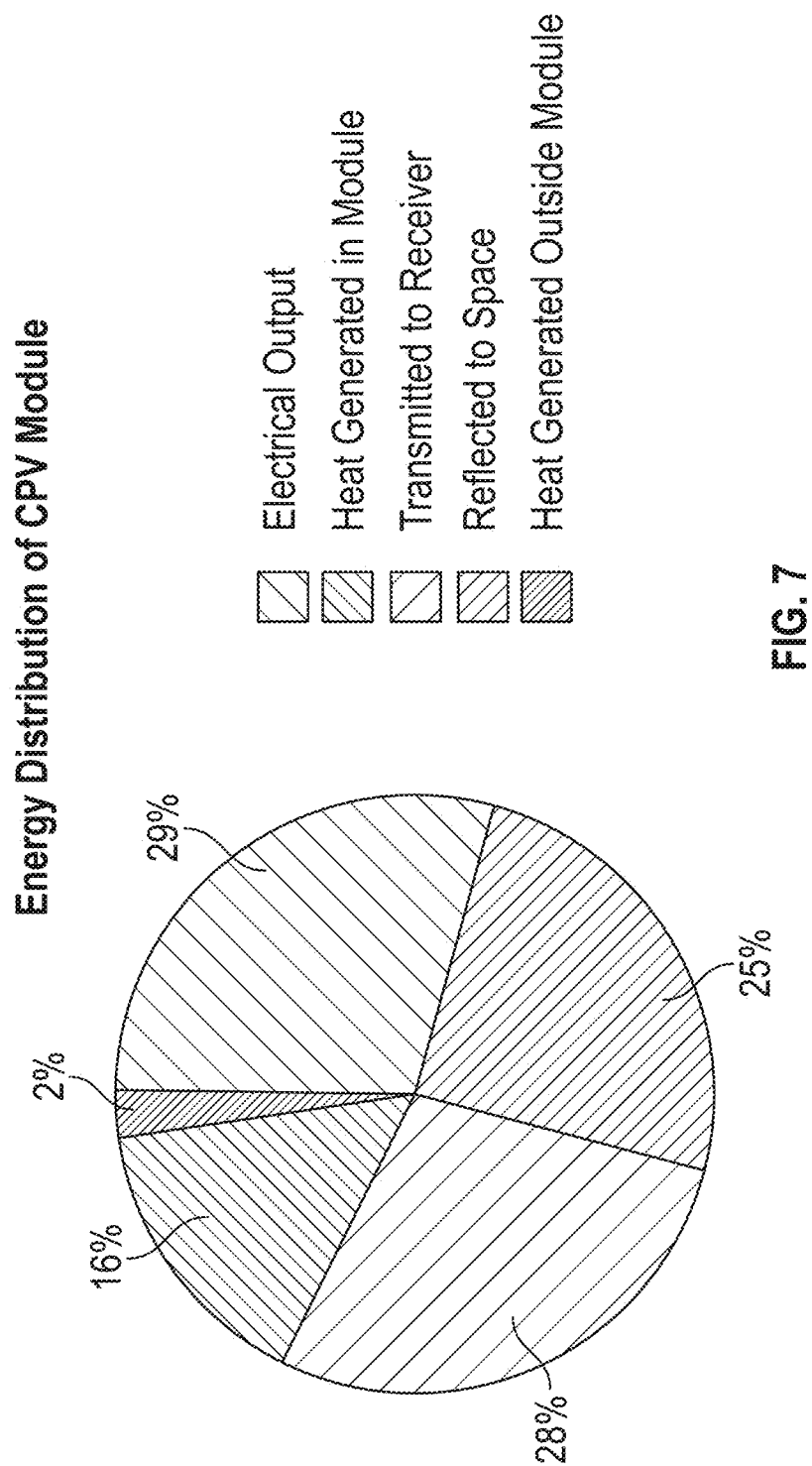
FIG. 7 shows energy distribution in one embodiment of a tCPV module.

FIG. 3 shows the details of one embodiment of the receiver 210. The tCPV module 400 is placed directly preceding the thermal receiver 350 along the optical axis of the concentrator 240 (see FIG. 2). In this embodiment, the concentrated solar light will be first absorbed by the tCPV module 400, with most of the remaining light passing through the module and reaching the thermal receiver 350.

Experimental

Thermal Receiver

Materials and Methods

A cavity receiver has been selected to intercept the bypass full-spectrum and CPV module filtered spectrum IR radiation. A cavity receiver allows for efficient absorption of incoming radiation while minimizing thermal losses through the use of a reduced aperture area.

Point focus dish cavity receivers designed for a liquid, or liquid-vapor HTF, are typically constructed out of a long, conically-wound tube helix. HTF enters the receiver at one end, and progressively increases in temperature throughout the length of the coil. The primary design objective is to minimize the temperature difference between the absorber surface and the exit HTF temperature, while keeping the overall pressure drop, $\Delta P$, manageable. Stated in other words, a large Nusselt number (Nu; or equivalently, a large convective heat transfer coefficient h) is favored for the receiver-HTF heat transfer interface. For the PV/T distributed small-scale system being developed, net thermal power and fluid flowrates are relatively low, and a simple tube-helix receiver would result in laminar flow over a long flow path, with a fully developed Nusselt number (Nu=4.36, constant heat flux laminar flow) and unfeasibly high pressure requirement.

As a result, non-traditional construction methods were examined. A solution was found using thermoplates: thin sheets of metal (e.g., a nickel-based alloy) are resistance, arc, or laser welded to form a cell, complete with interior grid-pattern welds, then inflated using hydrostatic pressure to form a thin channeled structure. These are sometimes called dimple plates or pillow plates, and can easily be formed into various shapes and made from alloys which are known to be compatible with the molten nitrate salt HTF at elevated temperatures. Examples of commercial heat exchangers formed from pillow plates are shown in FIG. 8. See also prototypes shown in FIGS. 11 and 12. The dimples mix the fluid flowing within the heat exchanger (HX), effectively increasing the convection coefficient and Nusselt number by a factor of 3× compared to parallel plates. Dimple spacing is driven by flow rate and channel spacing; an analogy with the analytical solution for heated cylinders in crossflow was used to find an optimum dimple size and pitch for the receiver.

Figure 9:
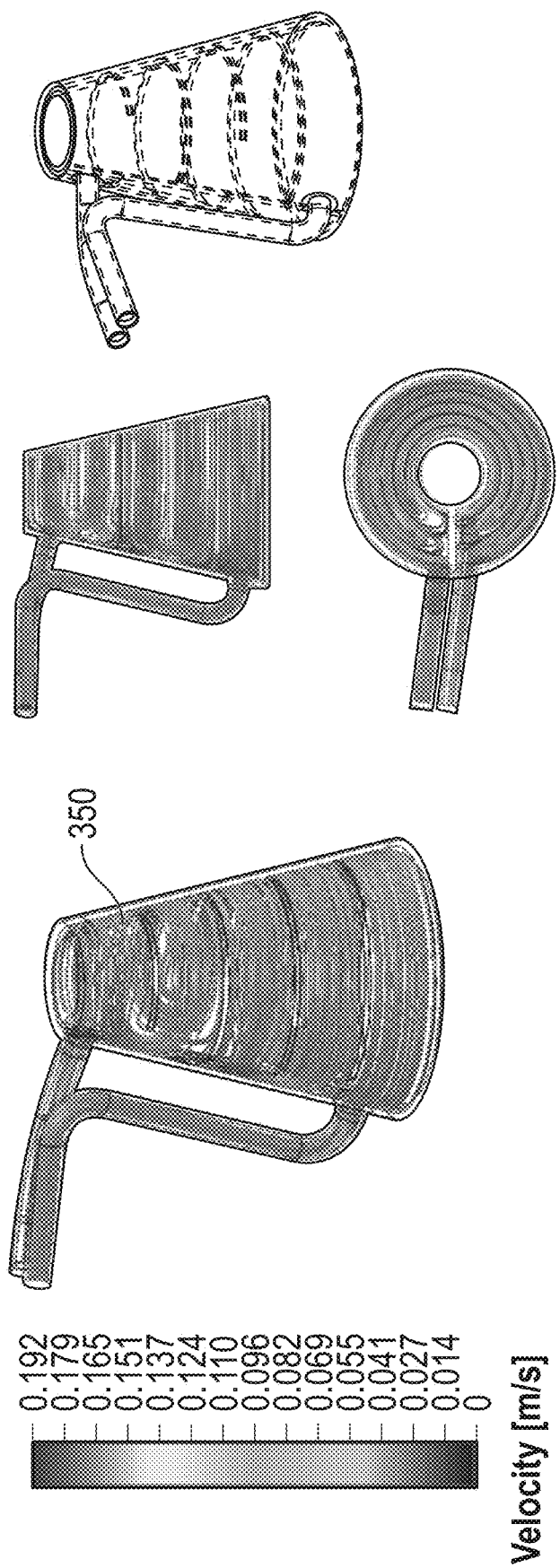
FIG. 9 shows a CFD simulation of HTF (heat transfer fluid) flow within structured channel receiver (dimples not shown).

The receiver aperture size is optimized for the incoming flux directional and spatial distribution. A simple conical dimple plate structure allows for ease of fabrication; internal baffles can be welded before expansion to create a structured serpentine flow path. This increases residence time in the receiver (t~10 s) and promotes uniform flow with minimal recirculation. (FIG. 9).

Figure 10:
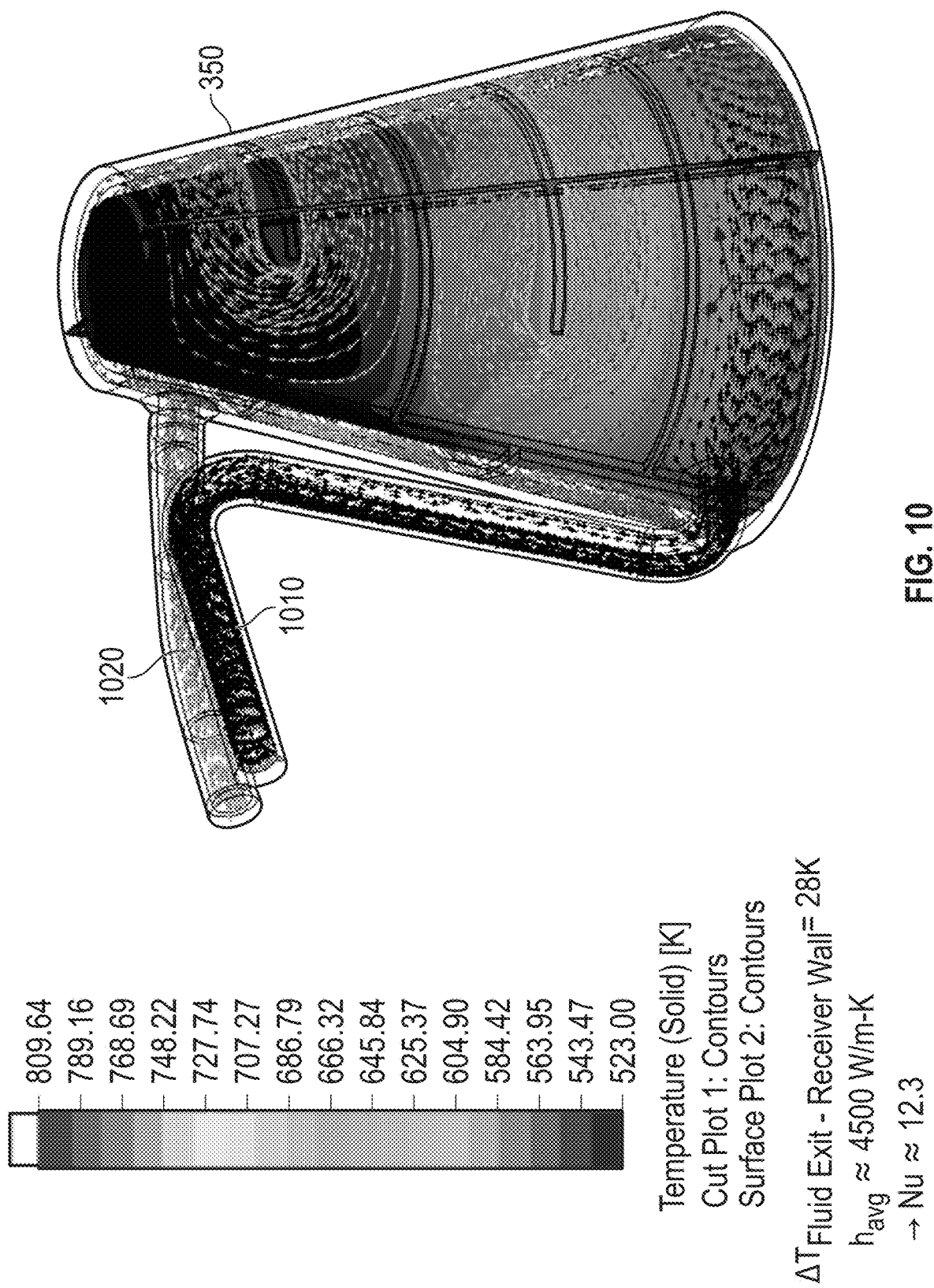
FIG. 10 shows a coupled thermo-fluidic simulation of HTF and receiver absorber surface temperature evolution (dimples not shown), uniform heat flux input.

The structured channel design provides for even heating of the HTF as it progresses throughout the receiver. (FIG. 10). Inconel 625 is selected as the alloy of choice for construction; it tolerates thermal shock well, has a very low corrosion rate in molten nitrate salts (0.5-2.0 μm/yr) and has been successfully applied to welded dimple plate HXs. The inner surface may be coated with Pyromark 2500 paint ($a_{so}$ iar=0.96, Sthermai=0.87), or alternatively left to oxidize, to improve selective absorption/emission performance. Inlet port 1010 and outlet port 1020 are shown in FIG. 10.

Figure 35:
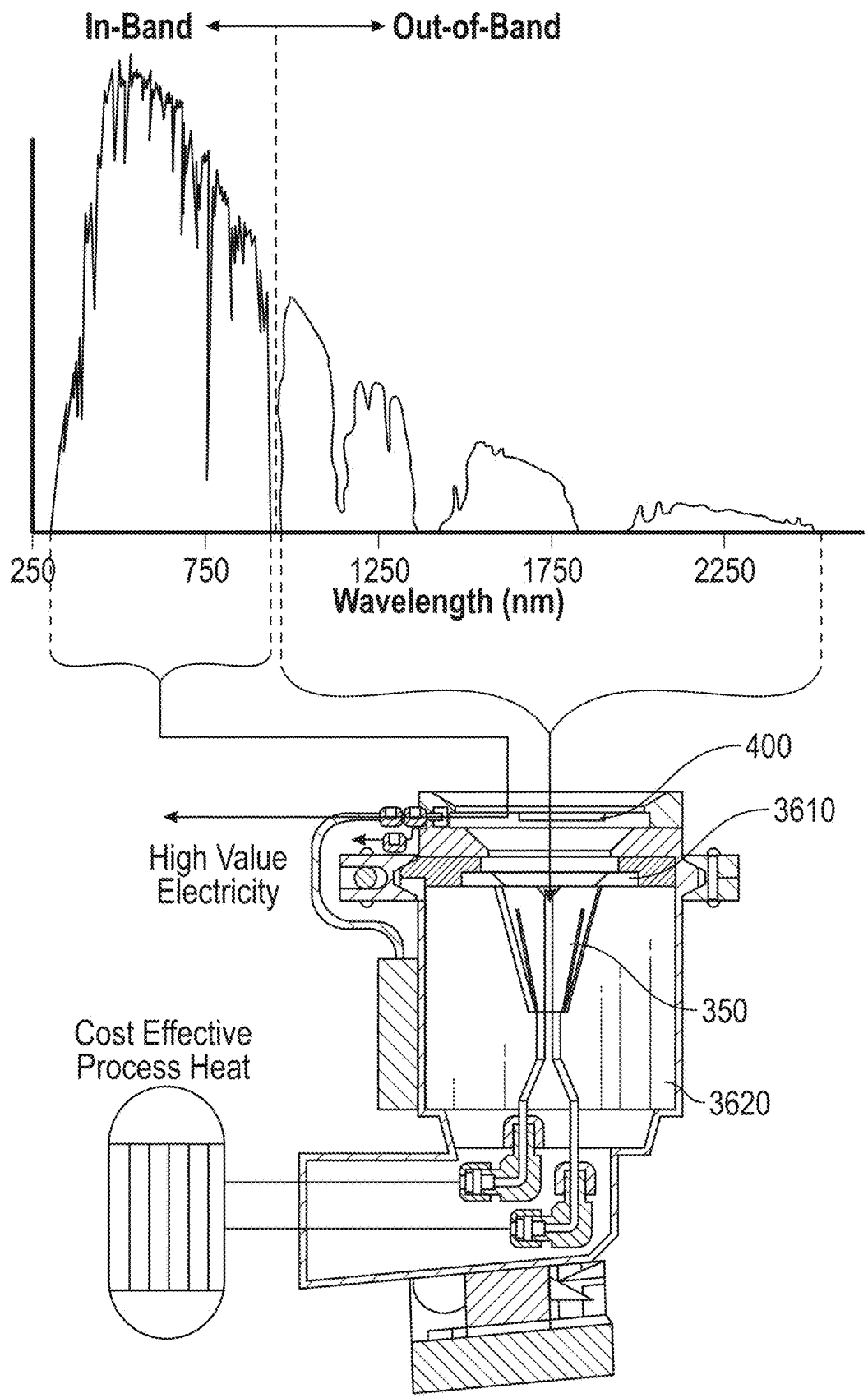
FIG. 35 shows one embodiment of the system and how in-band and out-of-band light are received.
Figure 36:
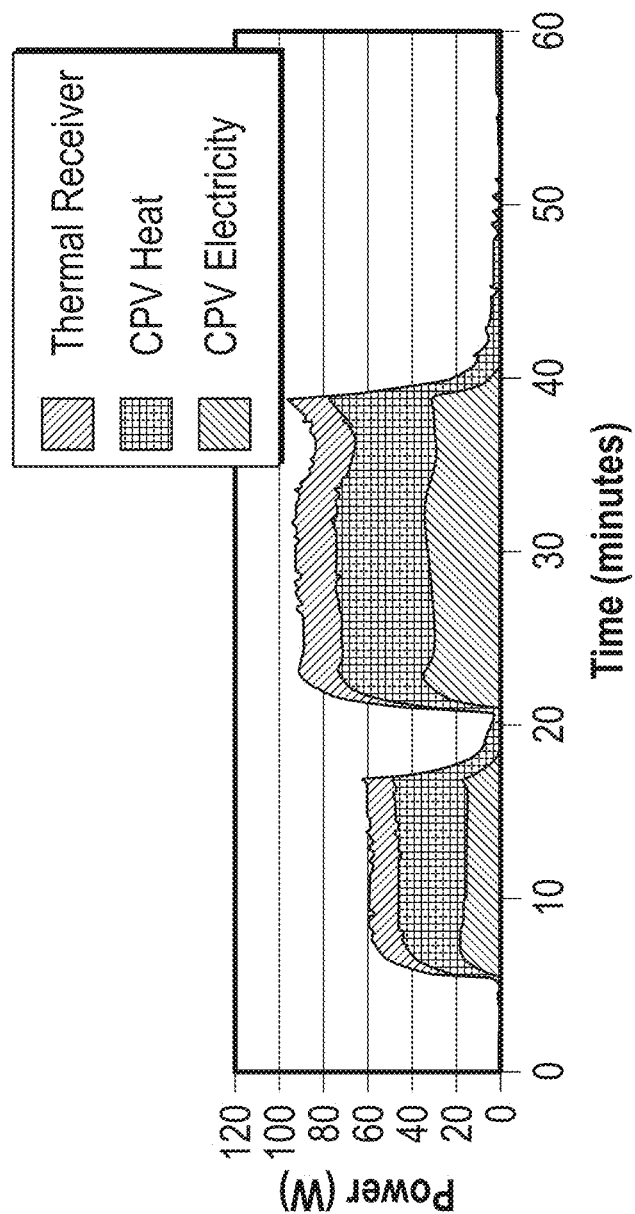
FIG. 36 shows the power generated by the system over time.

The receiver 350 is separated from the PV module with an insulating refractory board 3610 (see FIG. 35) (6.4 mm Silpower or RSLE-57 rigid silica board), which also serves as the primary thermal receiver aperture plate. An exterior casing 3620 shields the receiver and receiver insulation (e.g., 25.4 mm thick Microtherm microporous insulation), for a net 2.3% conductive loss. Table 1 lists key specifications of the thermal receiver.

TABLE 1

| Dimple plate thermal receiver specifications | |
|---|---|
| Input thermal power | 500 W |
| HTF fluid | Binary nitrate salt |
| Inlet HTF temperature | 250° C. |
| Outlet HTF temperature | 570° C. |
| Design Absorber-HTF ΔT | 28 K |
| Thermal efficiency | 91% |
| Dimensions | Entrance ID: 38 mm, exit ID: 12 mm, length: 50 mm |
| Material | Inconel 625, 0.5 mm sheet thickness |
| Absorber coating | Pyromark 2500 |
| Channel (expanded size) | 0.8 × 10 mm |
| Dimple weld diameter | 2.0 mm |
| Dimple spacing (center-center) | 6.3 mm |

A local aerospace industry fabricator (Electron Beam Engineering Inc., Anaheim, Calif.) specializing in electron beam and 2D CNC laser welding of high temperature alloys was engaged to perform the first and most critical step in receiver prototyping. The overall fabrication process is: (a) Fusion weld serpentine flow path and spot welds in 2D sheet stack; (b) roll form 2D flat pattern into conical receiver shape; (c) braze HTF inlet & outlet tube stubs onto receiver; (d) hydraulically expand HX to design flow channel thickness (0.8 mm nominal) using 0-10,000 psi [0-680 bar] manual hydraulic pump; (e) coat inner surface with Pyromark 2500 selective surface paint; and, (f) assemble into insulated receiver housing.

It is worth mentioning the effect of a process heat market application on the receiver system design. Table 2 highlights the key design parameters assuming the same t=0.5 mm Inconel 625 dimple plate receiver is used for both systems. The receiver can accommodate the increased operating pressure for the water HTF medium temperature system as the allowable rupture strength for the material increases dramatically at temperatures below 550° C. HTF flowrates remain laminar, and the dimple plate geometry is expected to increase convective heat transfer relative to parallel plates in both cases. Similar results are obtained for oil based heat transfer fluids. As a result, the same receiver can be used for water, oil and salt systems.

TABLE 2

Thermal receiver design parameter comparisons: high & medium temperature applications

|  | High temp TES/ electricity generation | Medium temp Industrial process heat |
| --- | --- | --- |
| HTF fluid | Binary nitrate salt | Water |
| Outlet HTF temp | 550-590° C. | 150-250° C. |
| Max receiver surface temp | 618° C. | 278° C. |
| Receiver max pressure (FS = 1.5, 100,000 h rupture strength) | 1.1 MPa | 7.4 MPa |
| HTF operating pressure | 0.2 MPa | 1.6 MPa |
| HTF flowrate | 2.2 L/h | 4.1 L/h |
| Reynolds number, HTF in 0.8 × 10 mm channel | 86 | 1058 |

Figure 11:
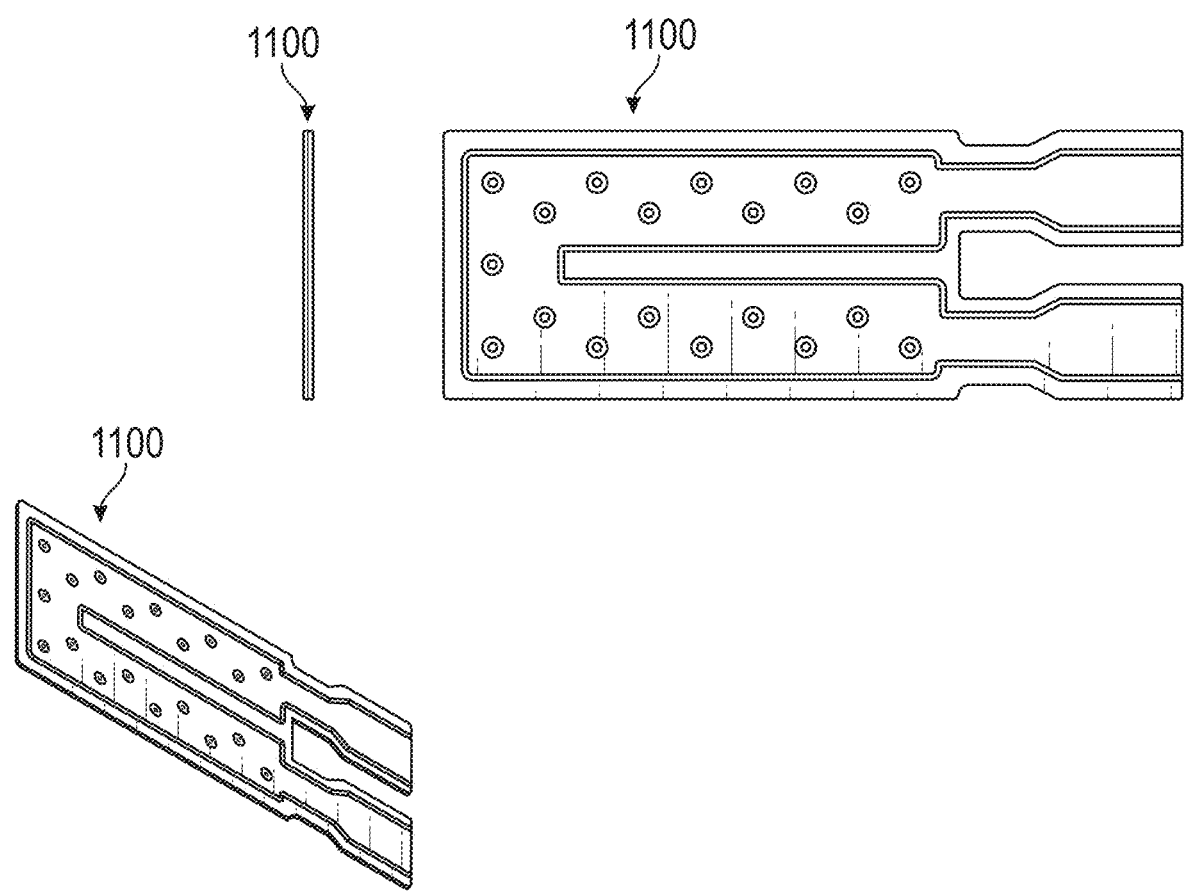
FIG. 11 shows a U-bend simplified receiver weld test 2D geometry (prior to inflation).
Figure 12:
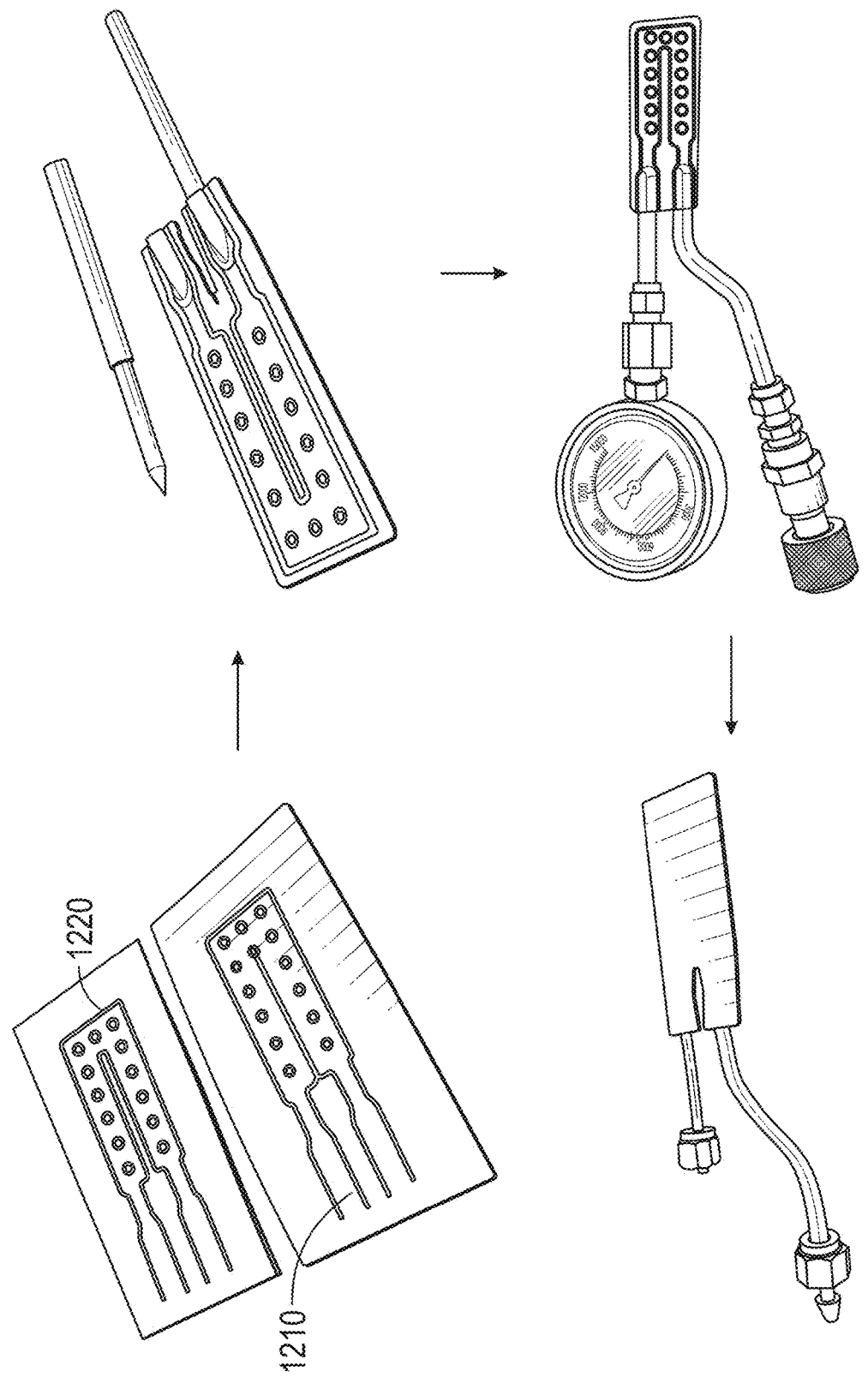
FIG. 12 shows a receiver prototype fabrication process.

To minimize fabrication and assembly risk, the first welded receiver prototypes consist of a simplified U-bend flow path 1100 (FIGS. 11 and 12). FIG. 11 shows a plan, end, and perspective view of U-bend flow path 1100. Two distinct weld architectures were explored: single and dual seam profiles (prototype receivers 1210 and 1210, respectively) with one or two weld seams separating neighboring flow channels. The laser welding vendor provided feedback as to the minimum dimple spot size resolution and pitch; a welding fixture was made to keep the blanks flat and serve as a heat sink for full-penetration welds while reducing the risk of burn through. The tube stub brazing and inflation trials proved successful: calculated pressures for inflation initiation of the 8.5 mm wide channels is 2,970 psi [205 bar], compared to the measured amount of 3,200 psi [221 bar]; pressure was increased to 6,000 psi [414 bar] to ensure full expansion against a containment fixture. Prototypes were expanded to channel thickness ranging from 0.8 to 1.5 mm. The completed receivers were placed in a thermal test flow loop as a passive component (unheated) to measure effective thermal and hydraulic losses and compared against the subsystem model.

Figure 13:
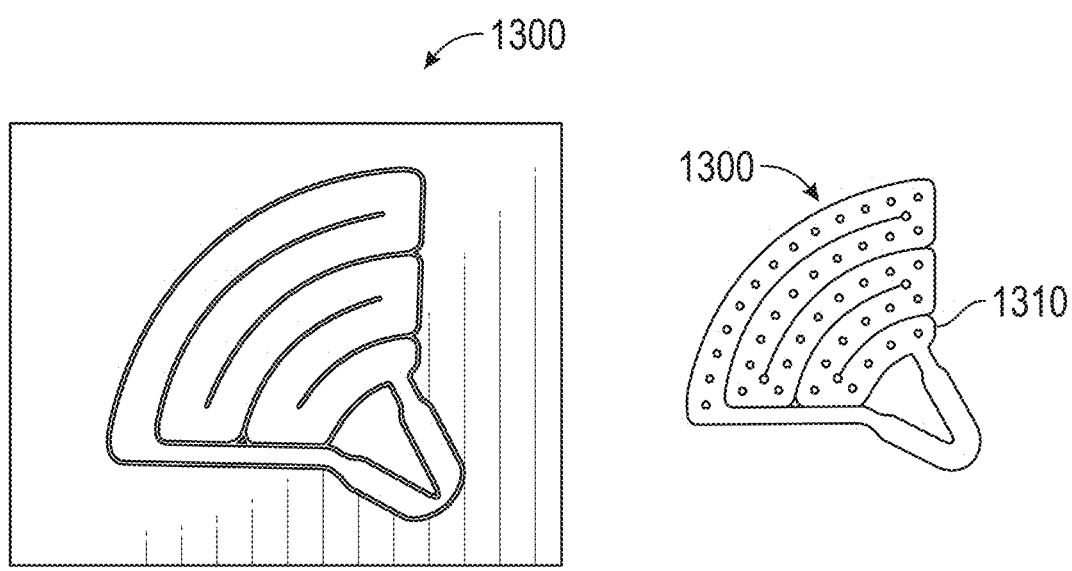
FIG. 13 shows a thermal receiver flat pattern flow profile; laser welded Inconel 625 profile awaiting dimple welds.

The conical full-receiver flat pattern geometry 1300 is shown in FIG. 13. Tooling and fixtures for cutting the profile perimeter 1310, forming the conical geometry and controlling the inflation thickness, has been developed (FIG. 14). A 500 W cartridge heater 1510 was used with an aluminum receiver insert 1520 to simulate isoflux heating for laboratory testing (FIG. 15).

Figure 38:
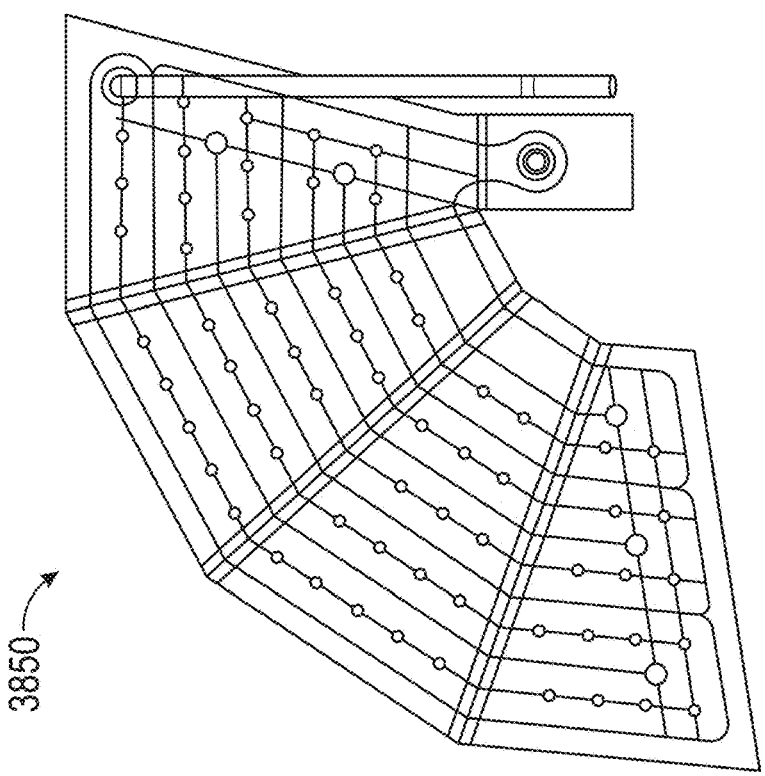
FIG. 38 shows the embodiment of the receiver in FIG. 37 prior to shaping.
Figure 37:
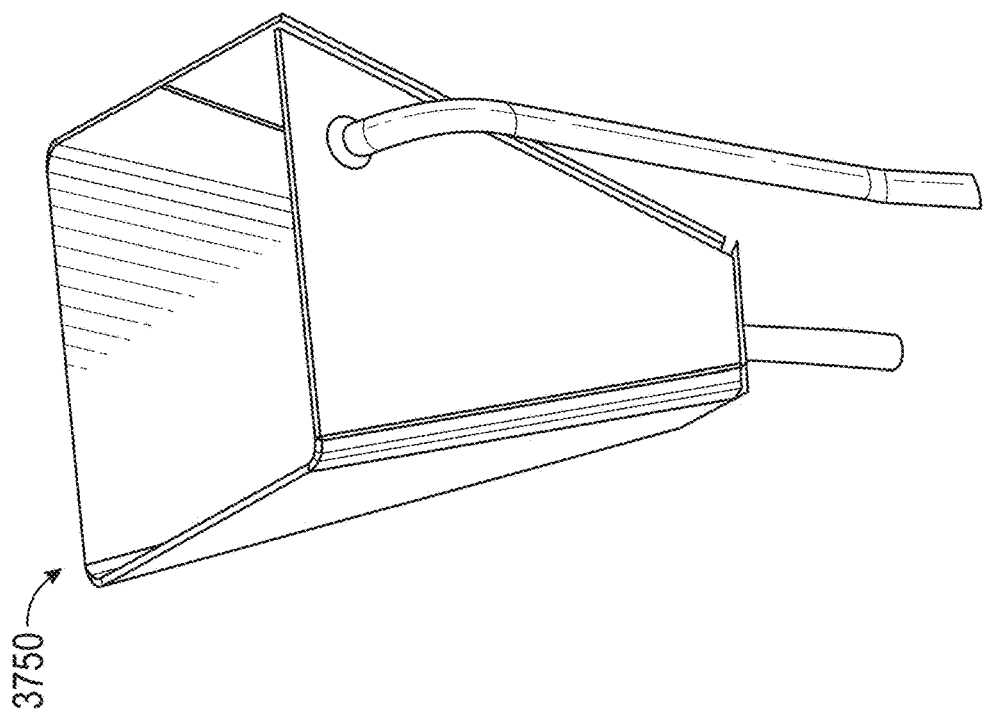
FIG. 37 shows an alternative embodiment of a thermal receiver, wherein the receiver is pyramid shaped to match the focal planes of a square or rectangular concentrator (as compared to a parabolic concentrator).

An alternative embodiment is shown in FIGS. 37 and 38. FIG. 37 shows a pyramidal thermal receiver 3750, and FIG. 38 shows the pyramidal full-receiver flat pattern geometry 3850. It is speculated that a pyramidal thermal receiver would be better suited to square or rectangular concentrators, and the conical embodiment is better suited to curved or parabolic concentrators.

Numerical Modeling

A COMSOL analysis was conducted for a range of receiver flow path/internal channel designs. The intent was not only to optimize the receiver performance, but also to create a model compatible with the COMSOL system and PV module analyses. Two distinct HTFs were investigated: pressurized water and molten salt. In all of the cases modeled, the inlet and boundary conditions were the same for each fluid, and are summarized in Table 3.

TABLE 3

Summary of heat transfer fluid flow conditions

| HTF | Inlet pressure (bar) | Inlet Temp | Flowrate |
| --- | --- | --- | --- |
| Water | 18 | 120° C. x | 1.3 g/s (2.4 L/h) |
| Salt (Na—K NO3) | 1.2 | 250° C. x | 1.1 g/s (2.1 L/h) |

The portion of concentrated solar energy which passes through the PV array heats the conical thermal receiver 350. The flux will hit the surface after diverging past the focal point located at the receiver's aperture, and will be highly non-uniform. A visual and graphical representation of the heat flux distribution can be seen in FIG. 16.

The pressure drop and the flow distribution are the two parameters of interest in the computational fluid dynamics model. The flow should be relatively evenly distributed with minimal stagnation zones to minimize heat accumulation in any particular location of the receiver. The main thermal parameters considered in this analysis were the peak surface temperature and qualitative temperature profile distribution of the inner conical surface.

There were two primary degrees of freedom that were examined: the flow path and welding dimple spot density. Three distinct flow paths were decided on for preliminary modeling: (1) horizontal serpentine, with the fluid traveling horizontally along the surface, then dropping and reversing direction, repeating until reaching the bottom and exiting; (2) vertical serpentine, where the fluid traveling up and down the surface while also moving radially until reaching the exit; and (3) manifold flow, with the intent for the fluid to fill the entire top channel and then travel downward equally across the entire circumference, to be uniformly heated before reaching the bottom and then exiting the receiver. Welding spots/dimples could be placed along the fluid channels, and used to add structural stability to the receiver. For this analysis, three cases were compared using the horizontal serpentine flow path: no dimples, moderate dimple density (pitch>10 mm), and high dimple density (pitch<5 mm).

The best design is shown in FIG. 17, which is the thermal receiver 1700 with horizontal flow path 1710 with high dimple density. The vertical flow path had higher overall temperatures than the horizontal design, while the manifold design failed completely, with pockets of total stagnation that led to surface temperatures significantly higher than the other two designs. Furthermore, the salt and water HTFs displayed similar behavior in nearly every aspect, and as such, only the water HTF case is shown. A summary of all the results can be found in Table 4 below.

The unobstructed (no dimple) flow for the horizontal serpentine design was very uniform in the flow channels, with only minor variation in the corners. The dimple obstructions cause a slightly more dynamic flow, with low-velocity wakes behind the dimples, and slightly increased velocity going around them due to decreased effective cross-sectional area. The addition of is dimples does also increase the pressure drop across the system by roughly 50% for the highly dimpled case, but still remains within design limits.

Close inspection of the temperature profile in FIG. 17 shows that the dimples do create small variations in the area directly around the dimple spot. This is mainly caused by the higher velocity flow, creating a small but noticeable drop in the peak temperature as the fluid travels through the high-flux zone. For example, the peak temperature decreases as dimple density increases: 233° C. in the unobstructed case, 230° C. with moderate dimple density, and 223° C. with high dimple density.

The analysis shows the addition of dimples increases the receiver pressure drop, and the dimples do reduce receiver surface temperatures. It is not yet known if there is a point at which adding more welding spots becomes less beneficial, but the current results suggest that the horizontal serpentine flowpath, with some degree of welding dimples would be the optimal design. Table 4 summarizes all of the modeled configurations to give a qualitative comparison between the different flow paths. The outlet temperature is given merely to show what the temperature would be with the given parameters and heat flux, and also to emphasis that this is essentially an isolated system, with no external losses (conduction, external convection, reradiation).

TABLE 4

Summary of COMSOL configurations and results

| Model | Outlet Temperature ° C. | Peak Surface Temperature ° C. | Pressure Drop Pa |
| --- | --- | --- | --- |
| Water | | | |
| Manifold | 180 | 374.0 | 200 |
| Vertical Serpentine | 180 | 276.3 | 600 |
| Horizontal Serpentine (HS) | 180 | 232.7 | 600 |
| HS low dimple density | 180 | 240.5 | 900 |
| HS high dimple density | 180 | 223.2 | 900 |
| Salt | | | |
| Manifold | 447 | 608.8 | 200 |
| Vertical Serpentine | 447 | 545.3 | 540 |
| Horizontal Serpentine (HS) | 447 | 537.5 | 630 |
| HS low dimple density | 447 | 532.0 | 780 |
| HS high dimple density | 447 | 527.3 | 860 |

Experimental Testing

A prototype receiver U-bend 1810 was tested on a thermal flow apparatus (FIG. 18). As expected, pressure drop through the prototypes were proportional to the flowrate, driven by the overall pneumatic pumping inlet pressure differential.

Figure 19:
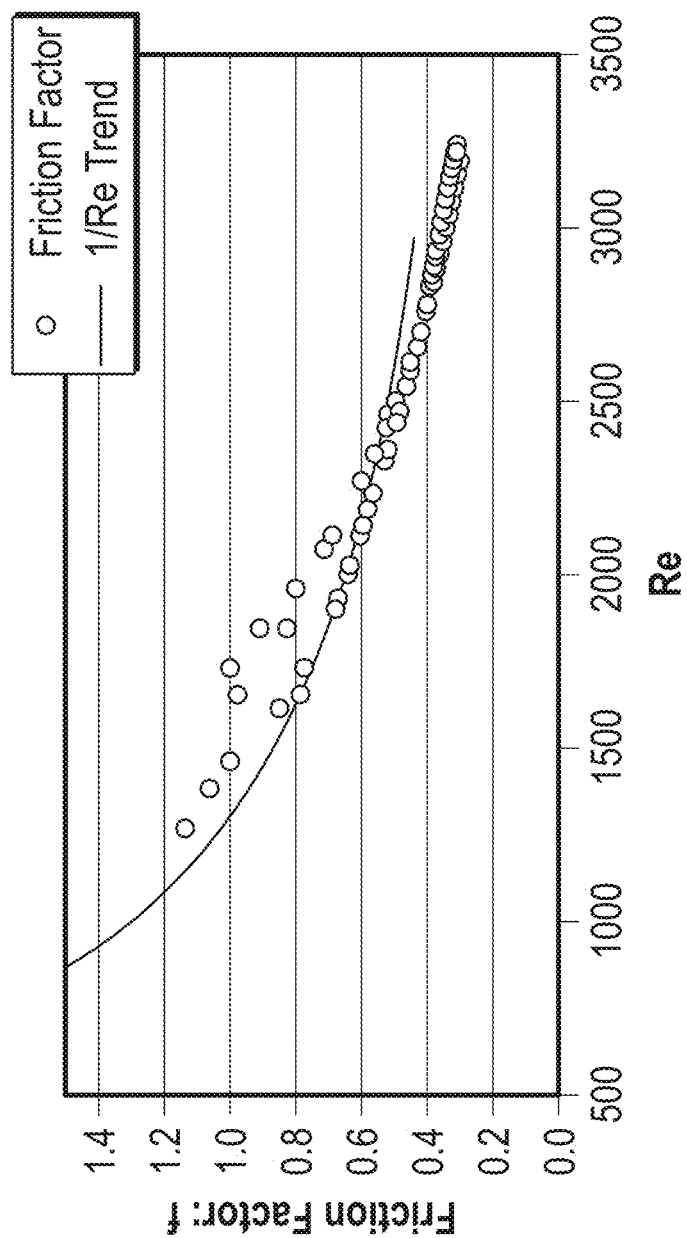
FIG. 19 shows the Friction factor vs Reynolds number: 1 mm expansion double seam receiver prototype. Reynolds number based on hydraulic diameter of flow channel adjacent to dimples.

Further tests were done to characterize the overall heat transfer coefficient and develop a correlation for the dimple plate friction factor as a function of Reynolds number. Experiments with the receivers immersed in an ice bath resulted in an overall heat transfer coefficient exceeding that of commercially available immersed heat exchangers (measured U=627 W/m2-K; typical non-agitated bath immersed U=200-500 W/m2-K)—supporting the hypothesis that small-scale dimpled geometry will provide an improvement in heat transfer capability. The friction factor was also computed from measured pressure drop and flowrates and compared to that of the model; the data shows good agreement to the inversely proportional relationship to Reynolds number in the laminar regime predicted by the Darcy-Weisbach equation (FIG. 19).

Figure 20:
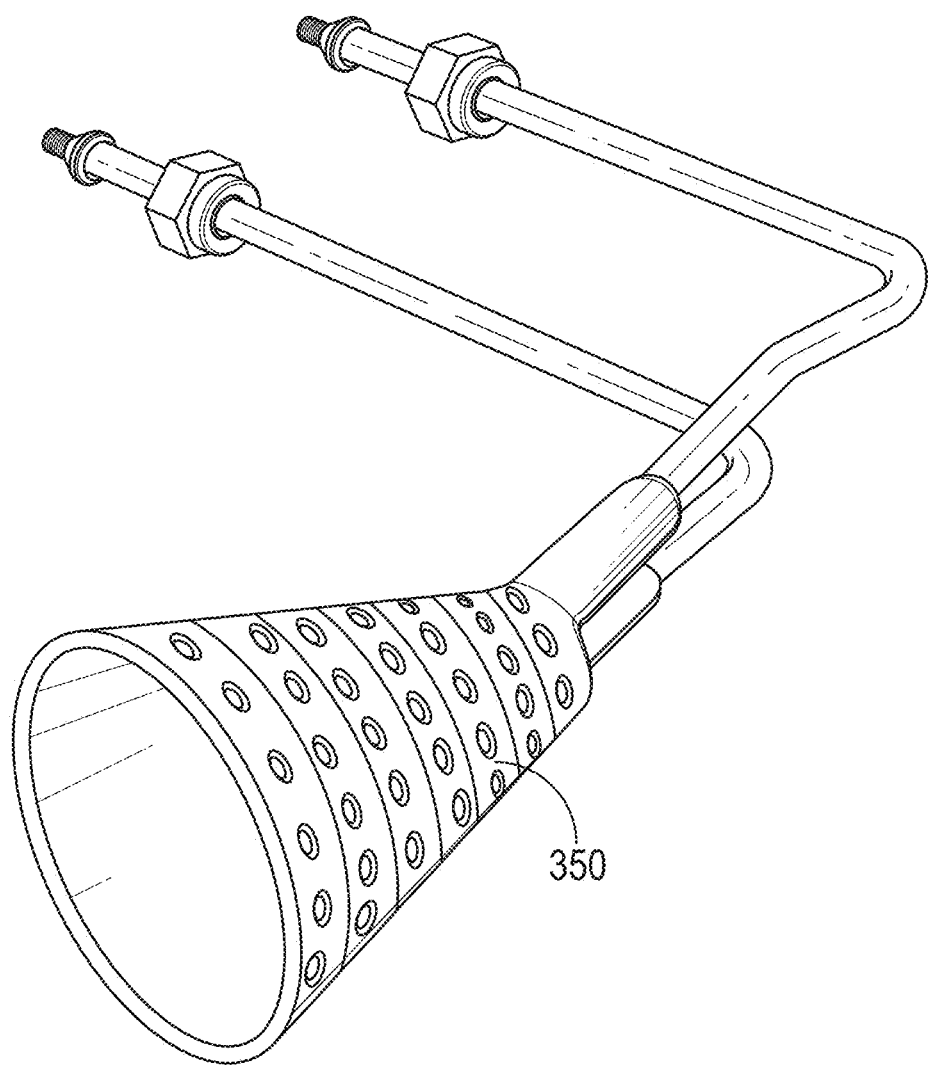
FIG. 20 shows a conical dimple plate receiver; Inconel 625 with Pyromark 2500 coating applied to inner surface; 38 mm entrance diameter, 12 mm exit diameter, 50 mm length.
Figure 21:
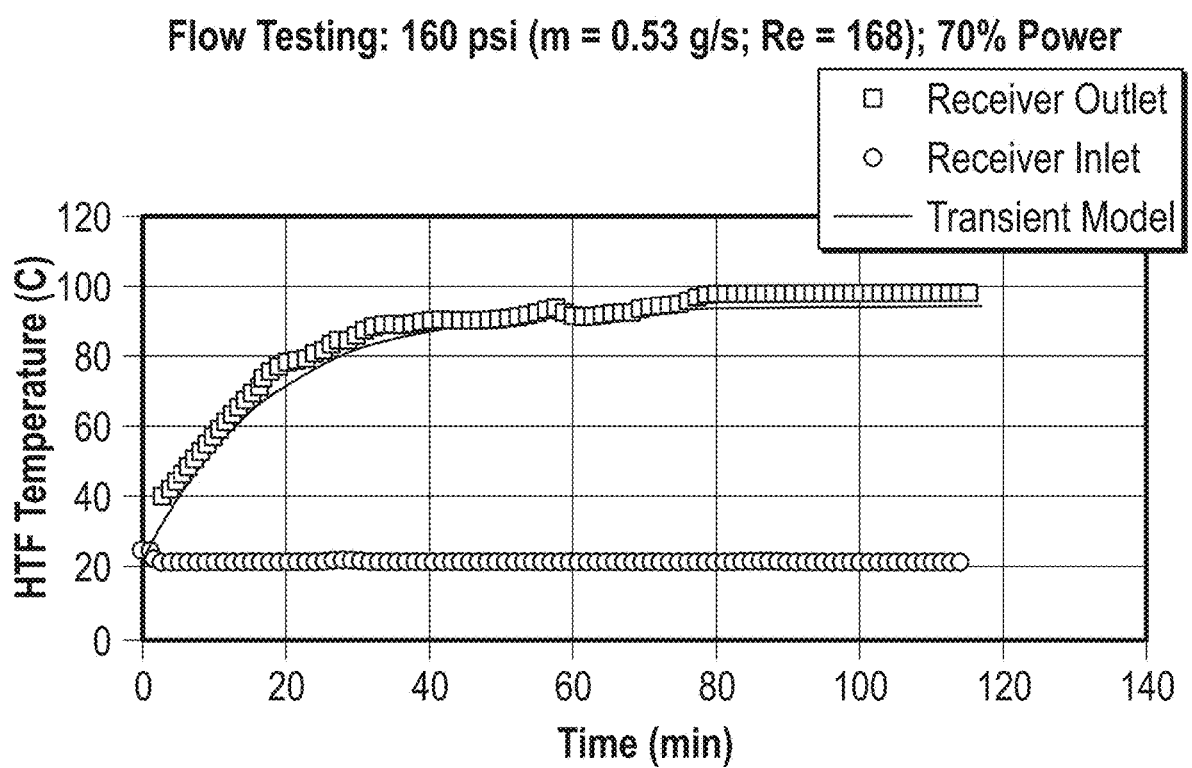
FIG. 21 shows a conical receiver lab heating test HTF temperature profile; 350 W cartridge heater power.

The full conical receiver geometry after forming and inflation is shown in FIG. 20. This receiver 350 was characterized using a pneumatic pumping flowloop with water HTF and inlet pressures ranging from 100-160 psi and resultant flowrates from 0.2-2.8 g/s. This receiver was then heated using a 0-500 W variable power cartridge heater insert; HTF temperatures are shown in FIG. 21.

Next the receiver was installed in a high flux 15 kWe xenon arc bulb solar simulator. Simulator power was adjusted using a combination of grating filter and adjustable current power supplies to produce optical powers at the system focal plane from 320-430 W, as measured by a calorimeter. Directional distribution was modified using a pair of plano-convex condenser lenses to more accurately represent the concentrated flux obtained from a parabolic dish. Water was pneumatically pumped through the conical receiver as simulator power was adjusted. The measured HTF temperatures and calculated HTF power extracted agree well with simulator input, indicating the conical receiver geometry enables efficient optical to thermal energy conversion. See FIG. 18.

Storage Tank

Materials and Methods

The low thermal loss budget and small system size have driven the design towards vacuum multi-layered-insulation (vMLI) tank designs, similar to liquid helium cryogenic Dewars. These are designed to minimize thermal losses to the environment while maintaining liquid helium at 4 K. A central tank containing liquid helium (LHe) is surrounded by a vMLI annulus, which is again surrounded by tank filled with liquid nitrogen. This assembly is further surrounded by a second vMLI chamber. (See FIG. 23). The liquid nitrogen annulus acts as a buffer to insulate the liquid helium contents from ambient temperatures.

Figure 24:
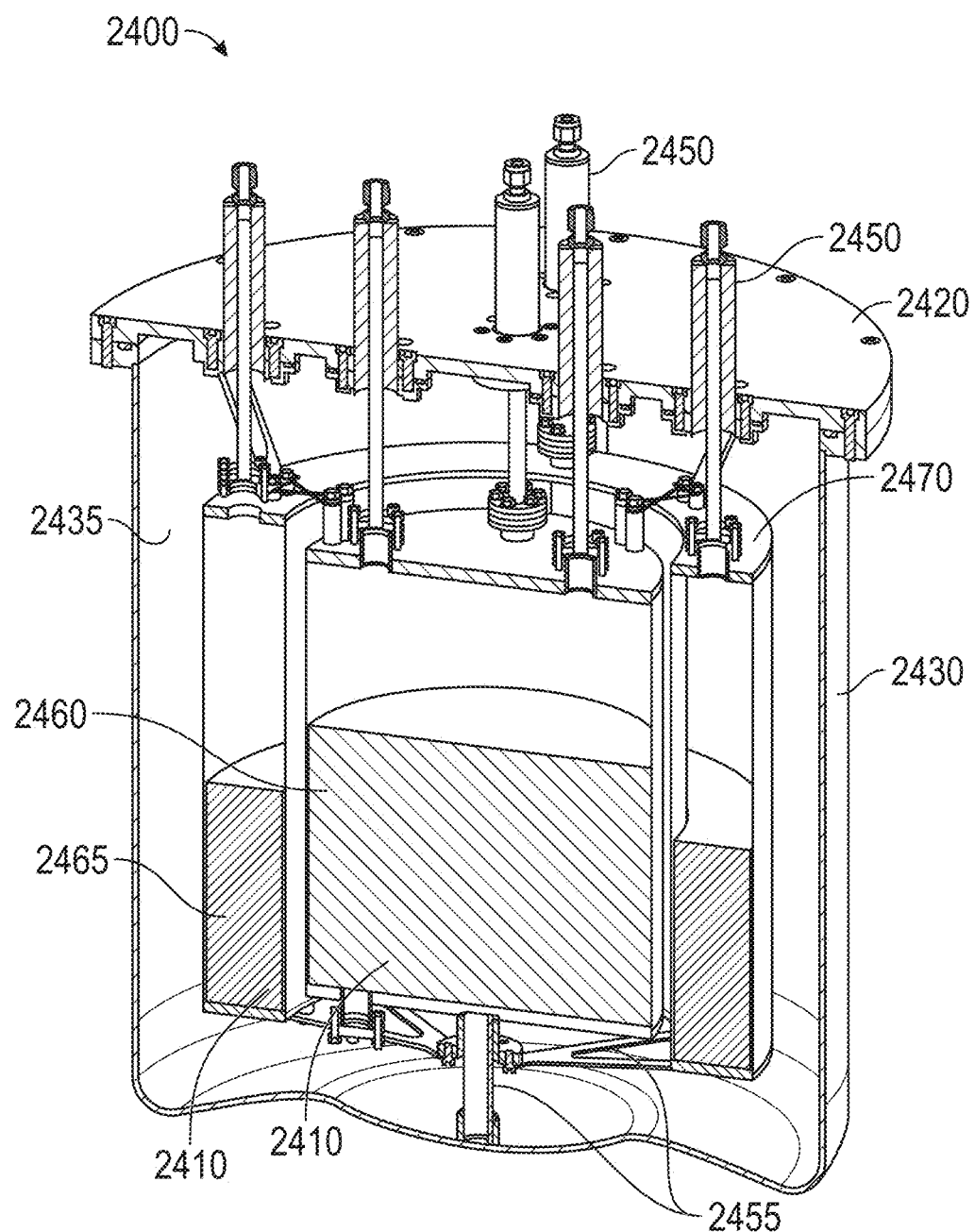
FIG. 24 shows the TES tank cross-section. The multi-layer insulation is not shown in the vMLI (vacuum) region.

The TES tank 220 (sec also prototype tank 2400) is made for high temperature use and incorporates electropolished stainless steel salt tanks 2410 to reduce radiative transfer (see FIG. 24). The outer vacuum vessel 2420 and lid 2430 are constructed from aluminum for reduced weight. The system is sized to hold 12 L of HTF, providing roughly 2.6 kWh of thermal storage. The PV/T tank-in-tank prototype design 2400 incorporates a removable machined lid 2430 with HTF dip tubes, pressurized air lines, instrumentation and heater wire lead feedthroughs in the form of glass sealed hermetic connectors 2450. Alternating layers of low emissivity copper foil and woven fiberglass cloth are wrapped around the tanks in the vacuum region 2435.

Key technical challenges include internal parasitic thermal conduction losses, which occur due to the internal tank supports 2455, tube feedthroughs 2450, and excessive prototype thermocouple instrumentation. Efforts have been made to reduce parasitic losses by avoiding heavy vacuum-bridging instrumentation and heater wiring. For example, the tank thermocouple probes were rerouted through vacuum insulated port extensions and are designed with a longer conduction path length, L (conduction losses ~1/L). Various vacuum getter materials have been identified, and they have been designed to sit in a remote reservoir attached via a short vacuum conduit to keep their operating temperatures low and maintain long term gaseous absorption performance.

Concentric tanks, similar to the liquid helium Dewars with liquid nitrogen shields, are beneficial for several reasons. First, the compact design reduces total exposed surface area, minimizing losses to ambient, and reduces the number of vacuum seals that must be maintained. Second, the total losses from the hot tank will be reduced due to the higher temperature of the shield as compared to ambient temperatures. Finally, hot tank losses are not dissipated to ambient, but rather are largely absorbed by the cold tank, which preheats the cold salt and limits the amount of electrical heating required to prevent the salt from freezing.

Vacuum insulation for high-temperature heat retention has precedent in the solar industry in evacuated tube solar receivers for parabolic trough systems. These systems have slightly lower temperatures (300-400 C) but higher surface areas. These systems should provide precedent for maintaining the required vacuum over long lifetimes.

The required insulation rate is based on the total energy stored and the duration of energy storage. Since the purpose is to continue to generate electricity in the absence of solar resource, time scales of storage may be ~30 minutes for solar transients due to cloud cover, ~6 hours for assisting with peak load times in the evening, or ~17 hours for maintaining electricity generation for the entire time that solar resource is unavailable.

For a six-hour storage time, and for 2.6 kWh of thermal energy storage, in order to maintain 95% of the stored energy, the required thermal insulation is far in excess of ambient-pressure insulation materials. The steady-state loss rate must be kept below about a 21 W. An analysis was conducted to determine the vacuum levels and insulation materials required to reach this low loss rate. Using a model of combined gas thermal conductivity, insulation fiber thermal conductivity, and radiative transfer between reflective foils, an insulation was designed that could meet the loss requirement. Preliminary data shows that the model's predictions are accurate, however the tank has yet to be tested at actual operating temperatures and pressures.

Each tank is equipped with a sheathed 400 W cartridge heater which can be used for preheating before testing. In a worst case scenario, these heaters are sufficiently powerful to melt a tank full of solidified HTF in a reasonable time. Additionally, each tank has external wall mounted temperature sensors and internal thermocouple profile probes to fully characterize the temperature field within the TES assembly.

The TES tank is designed with a removable lid 2420 for access to the HTF storage tanks 2460 (hot salt storage) and 2465 (cold salt storage); each HTF tank has a removable CF flange block-off plate near the tank bottom which can be removed to flush out any fluids. All internal ports are coupled to the lid with CF flange knife edge seals 2470 which utilize consumable copper gaskets.

Results and Discussion

Once the tank 2400 was fabricated, it was connected to a thermal flow loop and validated using a series of performance tests. First tests used water as the HTF, cycled between 25-90° C. The system was subjected to a 120-minute charging cycle, then allowed to dwell overnight while monitoring internal HTF and tank wall temperatures. Measured losses over the 8+h storage period were 2.3 W, which agreed extremely well with the model's predicted losses for these water HTF conditions. The measured losses represent a six-hour round-trip storage efficiency of 96.4%.

There were no impediments to fluid addition or extraction via pneumatic pumping; hence the unit can easily achieve the PV/T system power extraction rate.

Next, the central TES tank was evacuated, preheated and filled with molten nitrate salt. During HTF transfer, the salt was heated to 565° C.; no signs of thermal strain, leaks, or catastrophic loss of vacuum were observed. However, it is worth noting that the TES vacuum pressure gradually rose during the preheating and hot salt filling process, from 20 mTorr to over 1 Torr after 1 week at temperature. This was to be expected, as the tank did not undergo a vacuum bake out process before the manufacturer's shipment. The hot salt HTF fill acted as a surrogate bake-out procedure and the vMLI layers outgassed. The tank was sent for a vacuum repump to 0.1 mTorr; during this time the external vacuum molecular sieve was regenerated.

Figure 25:
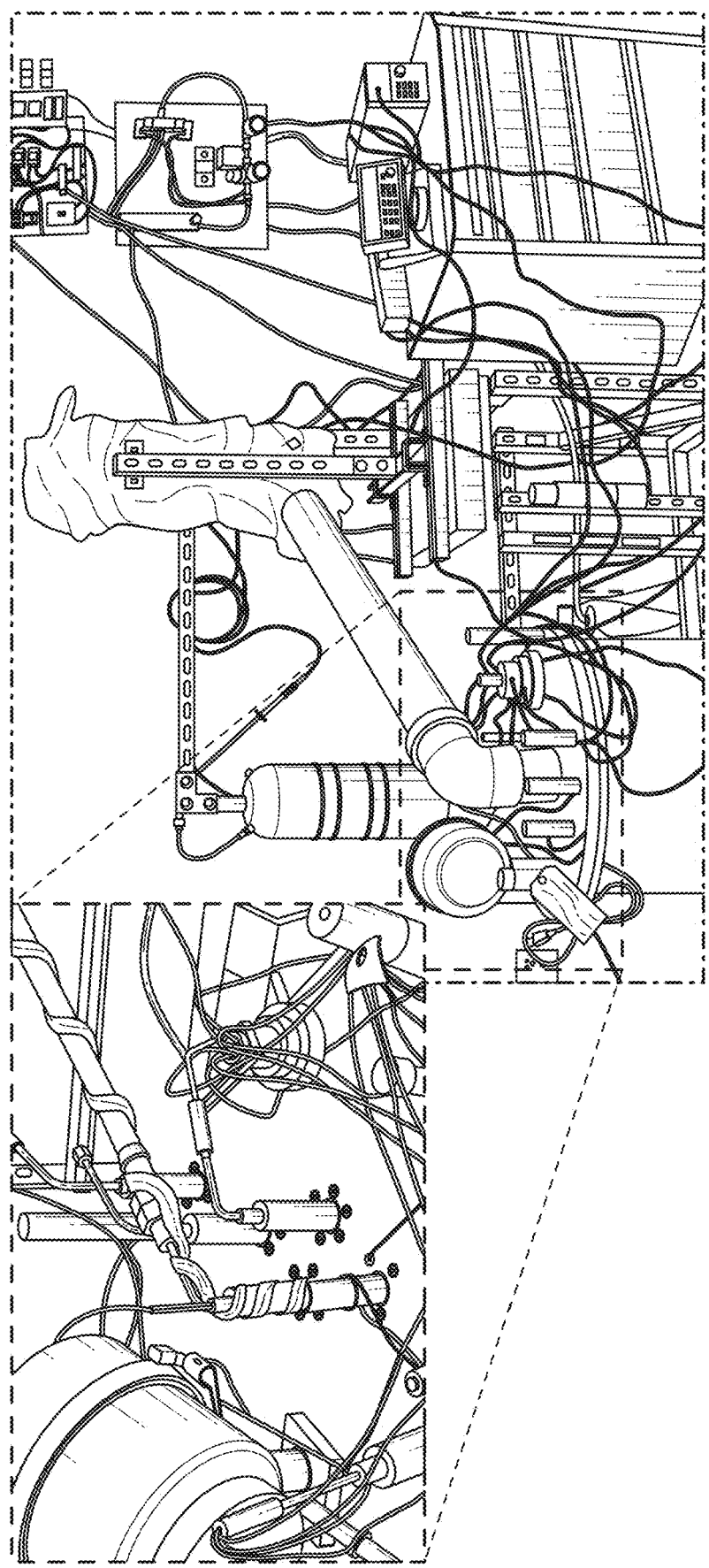
FIG. 25 shows the TES tank connected to thermal flow loop with external melt/preheat tank.

Initial TES performance testing includes various HTFs (liquid nitrogen, water and molten nitrate salt) with temperatures ranging from −196 to 575° C. For all tests, the tank internal temperature field is captured using immersed profile probe thermocouples, along with discrete tank wall temperature surface mount thermocouples. Tank vacuum pressure is measured using convection and ionization gauges. FIG. 25 depicts the TES 2400 connected to the thermal flow loop, whereby the external flow loop tank (2×1200 W band heaters) is used for melting and preheating the salt HTF before transfer into the vMLI TES tank. During salt melt and transfer, external heat trace resistance heaters (450 W total) were installed under insulation to preheat transfer piping.

Figure 26:
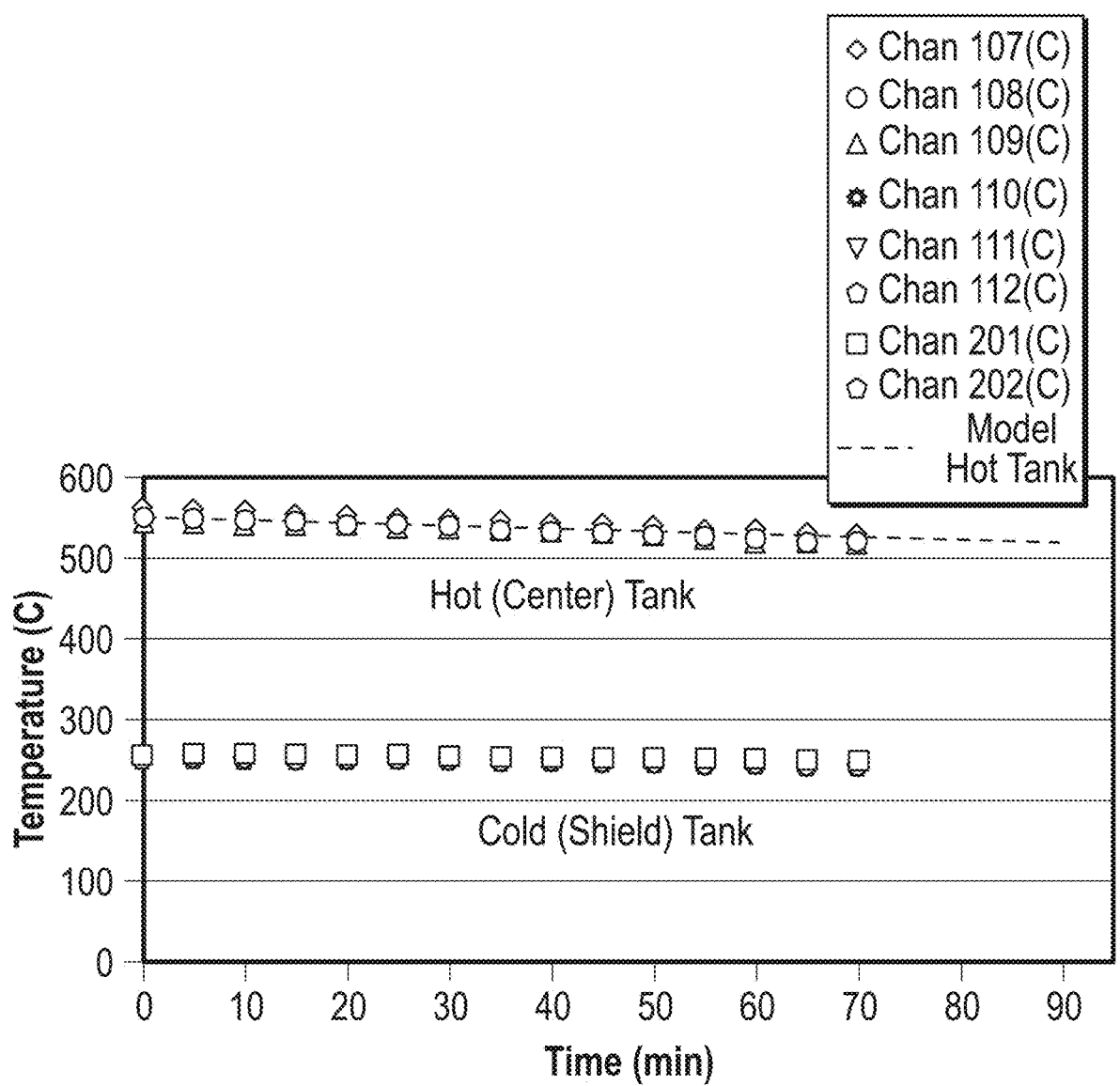
FIG. 26 shows TES internal temperatures: hot tank with 18 kg nitrate salt, 1.05 Ton-vacuum pressure, 90 min storage duration.

Both water and liquid nitrogen tests show performance on track to meet the design targets. Preliminary salt test data also shows excellent agreement to the vMLI TES model, when adjusted for increased vacuum pressure. The HTF bulk temperature decreases nearly linearly as a function of time, as expected. The annular shield tank, while empty, also decreases in temperature as a function of time, but at a slower rate (FIG. 26). Table 5 summarizes key TES tank performance metrics tested to date.

No signs of thermal strain, leaks, or catastrophic loss of vacuum were observed during testing. However, the TES vacuum pressure gradually rose during the few weeks after receipt of the tank, and then rapidly rose during the tank preheating and hot salt filling process. The design pressure is 0.1 mTorr (0.014 Pa) which limits conductive losses in this rarefied air regime. The observed increase in vacuum pressure to well over 1 Torr (140 Pa) after 1 week at 550° C. was expected, as the tank did not undergo a vacuum bake out process before shipment. This shifts the air into a non-rarified regime, and both predicted and experimental thermal conduction losses are roughly an order of magnitude higher. The tank was subjected to rough mechanical pumping and molecular sieve regeneration, then connected to an oil bath diffusion pump to achieve the final design pressure. Ideally, the vacuum is anticipated to remain stable, with a design leak rate of 2.0E-9 atm cc/sec, in contrast to the pre-bake out measured rate of 3.0E-7 atm/cc/sec. These leak rates correspond to 5 year increases in vacuum pressure of 8.4 mTorr and 1300 mTorr, respectively. The former result is acceptable with only a very small degradation in thermal performance, and it is anticipated that a real system would undergo a vacuum repump every 3-5 years.

In general, the measured losses agree well with the model. These experimental losses represent a 6 h round trip storage efficiency of 96% and 55% for the water and salt cases, respectively. With the tank vacuum returned to the design target, the system is expected to achieve the 95% target for the salt case.

TABLE 5

TES experimental performance parameters measured to date

| HTF | Hot tank temperature (C.) | Shield tank temperature (C.) | Vacuum pressure (mTorr) | Measured losses (W) | Model losses (W) |
|---|---|---|---|---|---|
| Liq. N2-Water | −196 | 45 | 0.5-1.9 | 9.5 | 11.6 |
| Water | 64 | 33.5 | 8.5-11.5 | 2.3 | 2.5 |
| Molten salt | 550 | 250 | 880-1050 | 182 | 155 |
| Molten salt (Design point) | 570 | 250 | 0.1 | — | 20.8 |

Pneumatically Driven Heat Transfer Fluid and Plumbing

Materials and Methods

To keep TES and receiver system costs low, alternative salt HTF pumping methods must be employed. Conventional molten salt vertical-shaft centrifugal pumps are very expensive, pose long-term reliability concerns, and not designed for the low flowrates needed by the system. For example, a nominal 600 W thermal receiver with a nitrate salt HTF ΔT=300 K requires a mass flowrate of 1.3 g/s, or a volumetric flowrate of 2.5 L/h. This is several orders of magnitude below that of commercial TES molten salt pumps.

To address this, a pneumatic pumping system to transfer the HTF to/from the TES has been designed. During on-sun charging of the TES, the ullage space in the low temperature tank is pressurized to induce flow. This type of system is low cost, readily controllable, and amenable to the small scale of this PV/T TES system. A tradeoff exists between tube size and pressure differential, this competes with tube size, flow velocity, and residence time in the HTF piping. FIG. 27 depicts the pressure drop in the cold tank-piping-receiver-piping-hot tank flow loop. Losses are calculated for tank exits/reentries, valves, restrictions, viscous friction with the HTF piping to and from the receiver, l=1200 mm, and an assumed ΔP=100 kPa within the receiver. Pressures above 700 kPa (100 psi) are considered not feasible, resulting in a minimum piping diameter of 4.0 mm. At this size, the fluid would take 10.2 s to transfer from the TES tank to the receiver, and temperature drop losses (assuming 300 W/m2 losses through the insulated piping outside diameter) amount to 4.6 K for the round trip.

Pneumatic pumping has three main advantages for this PV/T application: (1) it can be effectively scaled down to fit the small scale, distributed system; (2) it is very low cost, requiring only an air solenoid valve for pumping actuation; and (3) pressurized air is potentially available for each unit, as it is needed for a pneumatic tracking bellows actuator.

Figure 28:
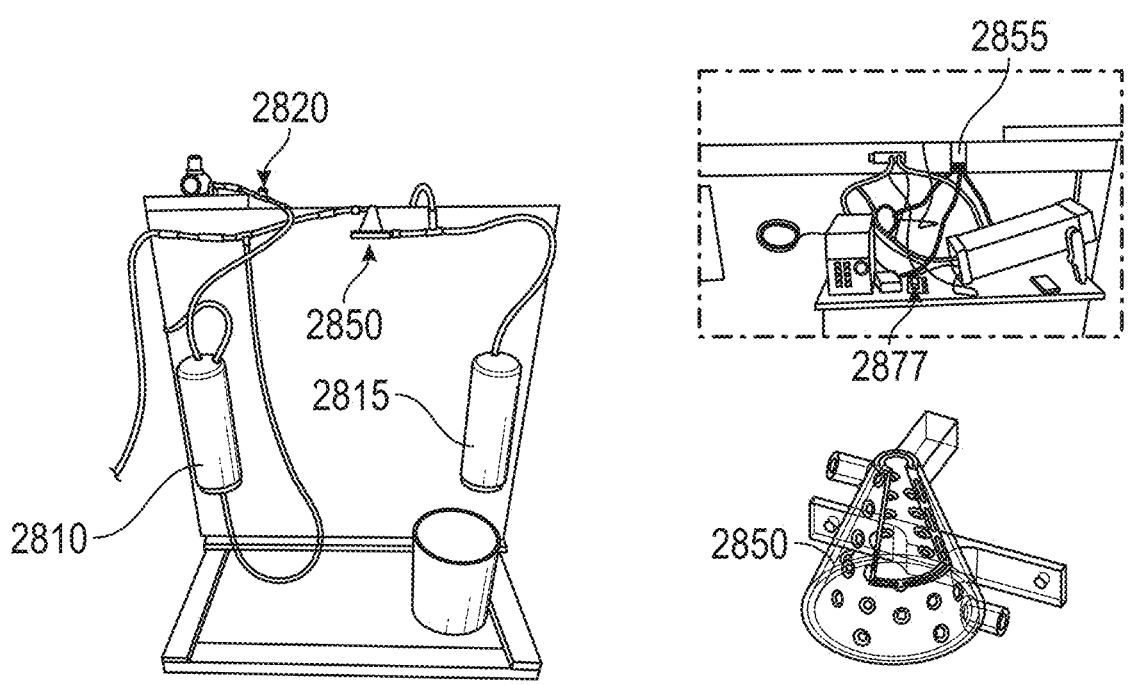
FIG. 28 shows a pneumatic pumping experimental setup.

To validate this concept, a prototype room-temperature pneumatic pumping rig was constructed (FIG. 28). A water-glycerol mixture was selected as the working fluid, allowing for room-temperature safe operation and control of viscosity to approximate the molten nitrate salt HTF viscosity, roughly 3 cP. Portable automotive air-ride steel tanks 2810 (supply tank) and 2815 (receiving tank) were joined to a 3D printed receiver prototype 2850 with push-to-connect fittings and flexible polyethylene lines. Control air pressure was managed by air regulator and a 12 VDC Clippard air solenoid 2820 (#EC-2-12) connected through a DC-DC solid state relay 2855 to a microcontroller 2857. PWM duty cycle and frequency were varied along with inlet air pressure to characterize and control HTF flowrate. The flow circuit was instrumented with a flowmeter and 0-150 psi pressure transducers. A check valve and needle valve were also integrated into the design to act as a blowout system.

Results and Discussion

Figure 29:
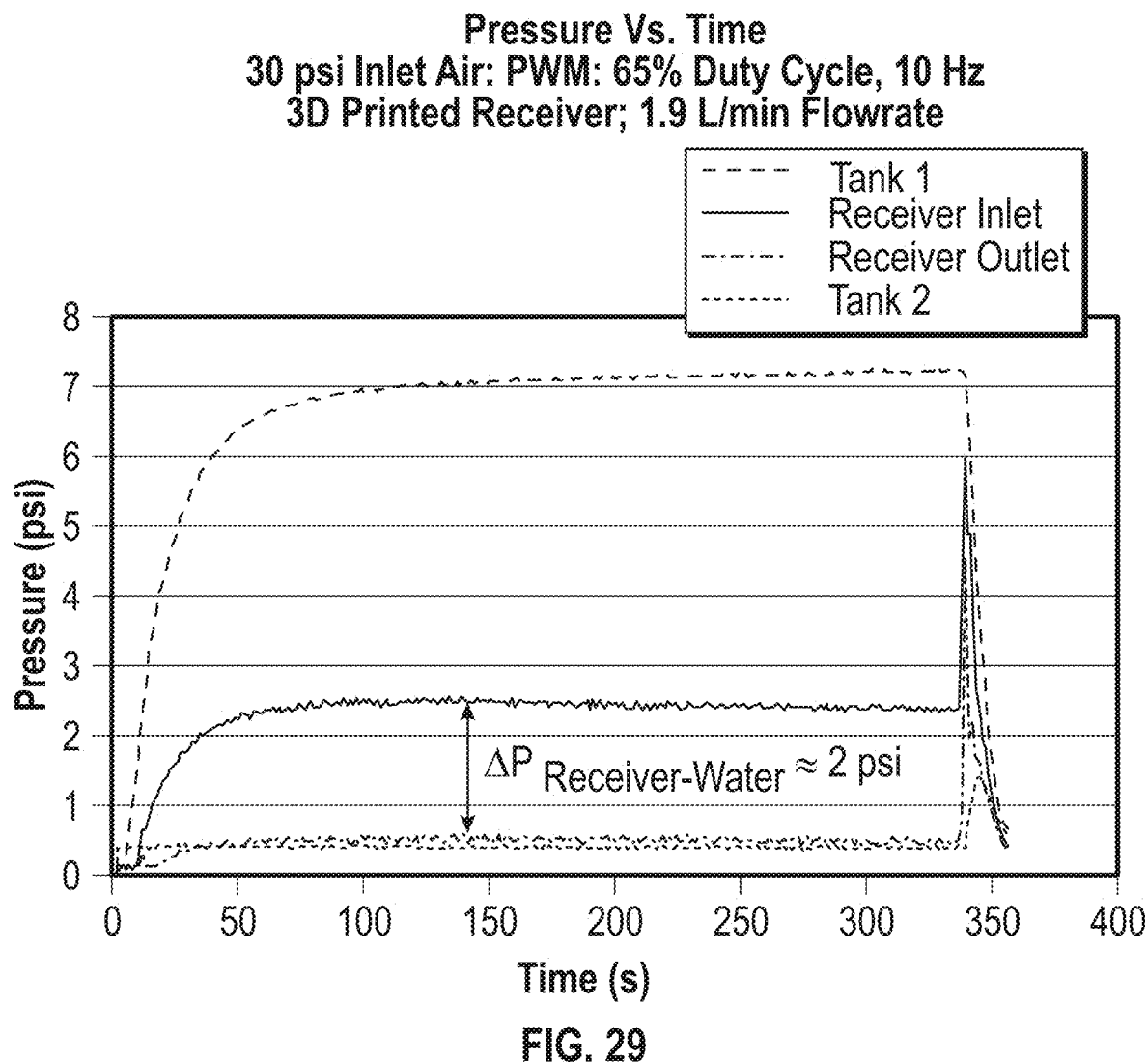
FIG. 29 shows pneumatic pumping test data: water flow calibration.
Figure 33:
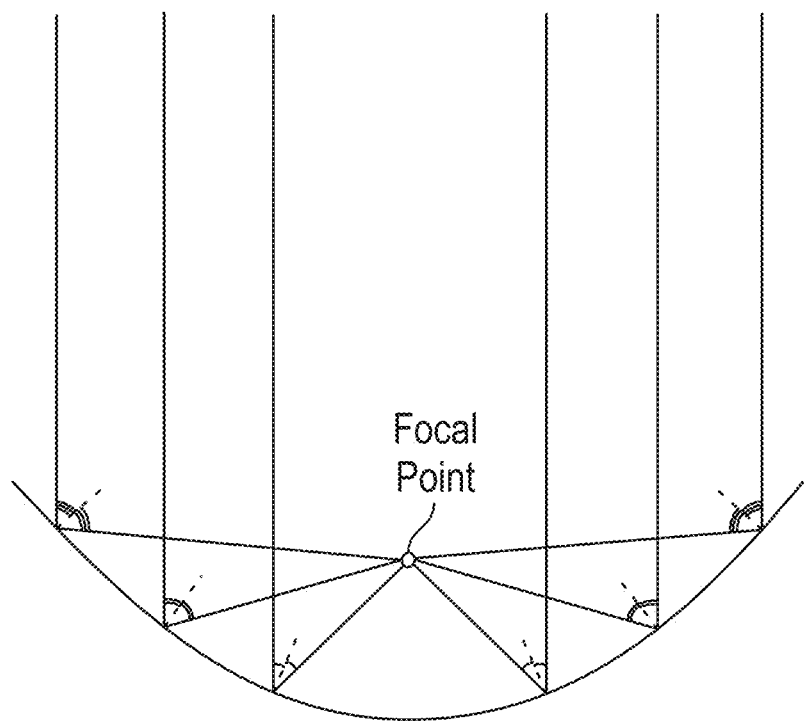
FIG. 33 shows a 2-D schematic of how a parabolic mirror reflects all incoming radiation, parallel to its optical axis, onto one focal point.

Test data shows viability of the pneumatic pumping concept, with lower than predicted pressure drops through the rapid prototyped dimple plate receiver (FIG. 29). This system was then replicated using high-temperature, molten-salt-compatible components. Direct mass measurements allowed for flowrates to be calculated as the HTF was shuttled back and forth, simulating charging and discharging modes (FIG. 30). Similar to the water-glycerol apparatus, portable automotive air-ride tanks 3010 (cold tank) and 3020 (hot tank) were used as the proxy for the integrated vMLI concentric TES tank. All wetted components were 304L or 316L stainless steel; several electrical trace heaters and band heaters were used to preheat the system and melt the salt, totaling 3.9 kW. These were controlled in 4 separate zones using self-tuning temperature controllers. To measure flowrate, one of the tanks was mounted to smaller, self-supporting frame positioned on a load cell (FIG. 31).

A 600 W Incoloy-sheathed cartridge heater provided thermal input and simulated the "on-sun" charging to be provided by the thermal receiver in the final system. This was housed in a custom 304L stainless steel concentric flow housing and controlled by an additional temperature controller. Several thermocouples were installed throughout the flow path and within the storage tanks to characterize the HTF flow circuit. Stainless steel Swagelok-type compression fittings connected the piping and various components. Flow control air pressure was managed by a 0-120 psi [0-8 bar] air regulator, and flow direction was controlled using a 5-port 3-way air solenoid valve; the flow circuit was instrumented with 0-150 psi pressure transducers. The entire flow system was insulated using 50 mm thick ceramic fiber insulation (Morgan Thermal Ceramics Cerablanket: k=0.062 W/m-K, nominal density=6 lb/cu.ft). Instrumentation was connected to an Agilent 34972A DAQ logger. Additional safety precautions necessitated a steel secondary containment pan capable of holding the entire salt volume (~12 L) should a leak occur.

Testing proved viability of the pneumatic pumping concept; this was reliably used for all receiver flow characterization studies. It should be noted for an Industrial Process Heat (ITH) system, the HTF may be pressurized and pumped using conventional means and distributed to a network of PV/T systems.

Solar Concentrator

Materials and Methods

The concentration system is designed to create a region (aperture) through which the solar radiation flux, or the amount of solar radiation per area, is several times greater than the normal intensity of solar radiation at the earth's surface. This allows harvesting of solar energy at lower costs, when the cost per area of the concentrator (mirrors and tracker) is much less than the cost per area of the energy harvesting device (in this case, CPV cells and thermal receiver). It also allows less losses in the thermal receiver as the losses of the thermal receiver scale with area.

Two approaches for light concentration are possible: reflective surfaces and refractive surfaces. Often systems with more than one optical element can use both reflective and refractive optics. Typical reflective surfaces include back-silvered glass and aluminized mylar. Typical refractive surfaces include PDMS (polydimethylsiloxane, or silicones) or glass.

The amount by which the light is concentrated is measured in two ways. The "concentration ratio" is the intensity of radiation at any point in the aperture divided by the intensity of radiation incident on the collector. The "Geometric concentration ratio" is the area of the aperture divided by the area of the collector. The average of the concentration ratio across the entire aperture is always less than the geometric concentration ratio due to losses.

Concentrators may follow the movement of the sun throughout the day to minimize the angle of the incoming light to the collector. This can be one by moving the collector along one axis, or along 2 axes.

One common shape of concentrators are parabolic mirrors, where the shape of the mirror is defined as a parabola in one or two axes. The aperture then lies at the focal point of the parabola, and the axis of symmetry of the parabola follows the sun in one or two axes.

Another common shape for concentrators are Fresnel concentrators, where a 3D optic is discretized into many narrow facets, and those facets are re-located to a more convenient location along the optical axis, for example on a plane. The facets may rotate relative to this plane, or the plane may rotate with the facets location fixed relative to the plane. The former (rotating facets) are common to reflective Fresnel optics whereas the latter (rotating plane) are common to refractive Fresnel optics. Each facet is such that a beam of light normal to the plane on which the facets lie will be re-directed, by the facets, to the focal point of the optic. This can be done in one or two axes.

Secondary optics are often designed to further concentrate the light, to create a desired illumination profile, or to tolerate imperfect alignment of the optical system relative to the incoming radiation. The acceptance angle of an optical system is the range of angles that an incident photon can have and still arrive to the aperture. Similar to primary optics, secondary optics can be reflective or refractive. A common shape for a secondary optic is a compound parabolic concentrator, which is formed by sections of two different parabolas. Compound parabolic concentrators are often used for their high acceptance angles.

Simpler secondary optics may be conical in nature, allowing photons which would have normally landed outside of the aperture to be reflected back to the inside of the receiver. The advantage of simpler conical receivers over more complicated and higher performing compound parabolic concentrators is that they are simpler and cheaper to manufacture.

Means of Moving the Concentrator

Sun movements are often described by two angles: the azimuthal angle and the altitude angle. The azimuthal angle is the angle of the sun along the horizontal plane and the altitude angle is the angle of the sun measured from the horizontal plane. Solar trackers are devices which move a solar system about one or two axes until the solar device aperture is pointing at the sun. For single-axis tracking, the incident angle of solar energy to the tracker will be small in the tracked axis, but will be large in the untracked axis. Two-axis tracking will have incident solar energy with a small angle in both axes. Devices with optical concentration systems typically require the pointing accuracy of the tracker to be between 0.1 degrees and 1 degree. For 2-axis tracking the mechanism (the tracker) that moves the collector must have 2 degrees of freedom and for I-axis tracking the mechanism (the tracker) that moves the collector must have 1 degree of freedom. Each degree of freedom must be actuated with a device, or an actuator, that rotates the entire assembly about the tracking axis.

The actuator is most commonly electro-mechanically driven, using a motor and one of several means for translating or rotating devices, including but not limited to gears, worm gears, slewing drives, levers, pulleys, and cables. Other types of actuators are possible, including pneumatic or hydraulic actuators. The trackers may contain sensors which determine the position of the tracker and/or the position of the sun. The actuators are commonly coupled with a control system which is responsible for moving the actuators so that the tracker and concentrator are pointing the correct direction. The control system may use the sensors and/or the time of day to determine the appropriate pointing direction. The trackers and control system are also responsible for moving the system to a safe, or a "stow" position when it is deemed necessary to do so, for example during high wind events.

Compact Heat Engine

Materials and Methods

The heat that is removed from the thermal receiver can be converted to electricity using a heat engine. A heat engine moves energy from a higher-temperature thermal reservoir to a lower-temperature thermal reservoir, while converting a fraction of that heat into electricity. The sum of all energy into and out of the engine, less any energy stored in the engine, must equal to zero. The three necessary flows of energy into and out of the engine are the heat flow into the engine from the high temperature reservoir, the work out of the engine via electricity, and the heat flow out of the engine into the low temperature reservoir. There may be other energy flows into and out of the engine or energy stored or released in the engine, but in the absence of these other energy flows, the work out of the engine can be said to be equal to the heat into the engine from the high temperature reservoir minus the heat out of the engine into the low temperature reservoir.

The efficiency of the engine is said to be the work out of the engine divided by the energy into the engine from the high temperature reservoir.

$$\eta = W\_out / Q\_in$$

The thermodynamic limit of the max possible efficiency of the engine is given by the Carnot equation $$\eta\_carnot = 1 - TC/TH$$

The Carnot equation means that a higher temperature of the high temperature thermal reservoir, and a lower temperature of the low temperature thermal reservoir is desired for a high-efficiency engine. The temperature of the high temperature thermal reservoir is set by the thermal receiver fluid exit temperature. For this reason, the heat engine can have higher efficiency if the thermal receiver is hotter.

Heat engines may operate using a thermodynamic working fluid, such as water, air, or organic fluids. The fluid is heated, expanded, cooled, and compressed using the heat input to the engine. The movement of the fluid is used to drive a mechanical shaft or crank, which in turn is used to generate electricity. Alternatively, heat engines may be solid-state, with no working fluid or moving parts, such as thermoelectric generators.

Integration of a Solar Thermal Collector with an Industrial Process Heat System

Materials and Methods

Figure 34:
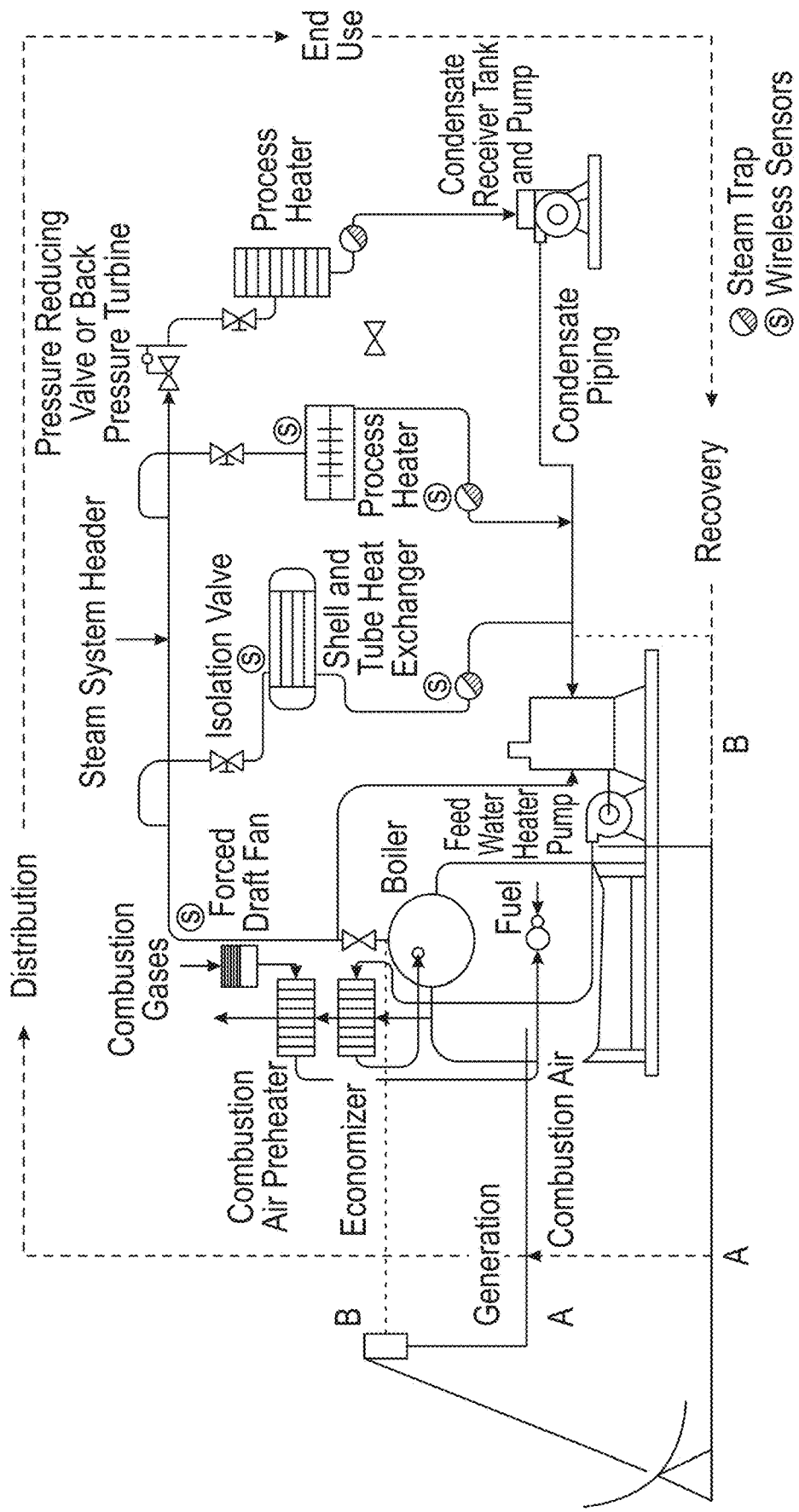
FIG. 34 shows a schematic of integration for a solar thermal collector into an existing boiler system. The solar collector will use the existing water supply tank, feed water pump, and boiler storage in order to minimize additional engineering costs.

The intent of the solar thermal collector is to add a renewable energy heat source without significant alterations to the existing infrastructure. Previous works have used solar boilers with their own piping and boiler systems (steam separator, flash tank, feed water pumps) however this incurs significant additional costs which make the system non-economical (30). The proposed design will utilize existing infrastructure of a boiler system including the feedback controls, feed water pumps, and steam storage in order to avoid these costs. This can be found schematically in FIG. 34.

A standard boiler system has a pre-heated make up water supply maintained at an elevated temperature in order to minimize the amount of heat needed to be added to boil the water. When the water level in the boiler drops below a certain level, water is injected into the boiler to be heated. In the boiler the water is maintained at a temperature at the boiling point. When the steam pressure in the heating system drops below a given value, the boiler turns on and begins to evaporate its contents until the pressure reaches the required threshold value at which point it shuts off.

The solar thermal collector could be introduced in the cycle to minimize the amount of time that the boiler needs to be actively boiling. This can be done in one of two ways (see FIG. 34). For low power situations the solar thermal collector can be used to preheat the feed water to the boiling temperature. This follows path A in FIG. 34. For high power situations the solar thermal collector can draw from the condensate return before the feed water pre-heat stage and directly boil the water. The output could go directly into the steam line and help to maintain the steam pressure required for the system. This follows path B in FIG. 34.

Any permutation of these could also be used. In a field of 20-100 collectors, some may be dedicated towards pre-boiling while others for direct steam generation. In this way the solar collectors act as a base load of steam while the existing boiler acts as a topping generator. This would minimize the used of fuels for steam generation resulting in cost savings for the facility.

In order to adopt such a scheme, a piping network would need to be set up in order to supply each dish with cold water and return hot steam. Further, a series of check valves and bypass regions would need to be used to ensure that any over production from the solar thermal generators can be safely dumped to the environment without negatively affecting the existing system. One method to avoid this is to size the installation so that the solar thermal generator will not exceed demand at any point.

What is claimed is:

1. A concentrated solar photovoltaic and photothermal system, comprising:
   a solar concentrator having a focal point;
   a photovoltaic module located near the focal point, the photovoltaic module having a first side facing toward the solar concentrator and a second side facing away from the solar concentrator, the photovoltaic module being at least partially transparent to infrared light;
   a thermoplate formed from first and second metal sheets welded to each other to create a structured channel and a plurality of dimples that mix heat-transfer fluid flowing within the structured channel;
   an inlet port through which heat transfer fluid flows into the structured channel; and
   an outlet port through which heat transfer fluid flows out of the structured channel;
   wherein:
     the thermoplate forms a receiving aperture that faces the second side of the photovoltaic module and through which infrared light from the photovoltaic module passes; and
     the second metal sheet forms an interior cavity that absorbs, and converts into thermal heat, the infrared light passing through the receiving aperture; and
     the thermoplate is thermally isolated from the photovoltaic module to reduce heat flow therebetween.

2. The concentrated solar photovoltaic and photothermal system of claim 1, wherein the structured channel forms one of a serpentine flow path and a manifold flow path.

3. The concentrated solar photovoltaic and photothermal system of claim 1, wherein the thermoplate further comprises a longitudinal axis and a plurality of structured channels forming a flow path perpendicular to the longitudinal axis.

4. The concentrated solar photovoltaic and photothermal system of claim 1, wherein:
   the thermoplate comprises a conical shape or a pyramidal shape; and
   the receiving aperture is a base of said conical shape or pyramidal shape.

5. The concentrated solar photovoltaic and photothermal system of claim 1, wherein the thermoplate is comprised of a nickel-based alloy.

6. The concentrated solar photovoltaic and photothermal system of claim 1, wherein the interior cavity is coated with a high absorptivity surface treatment.

7. The concentrated solar photovoltaic and photothermal system of claim 1, wherein the plurality of dimples are arranged along the structured channel with a pitch that is greater than 10 millimeters or less than 5 millimeters.

8. The concentrated solar photovoltaic and photothermal system of claim 1, further comprising an insulator located between the photovoltaic module and the thermoplate, the insulator forming at least part of the receiving aperture and thermally isolating the photovoltaic module from the thermoplate.

9. The concentrated solar photovoltaic and photothermal system of claim 8, wherein the receiving aperture allows at least some of the infrared light passing through the photovoltaic module to enter the interior cavity.

10. The concentrated solar photovoltaic and photothermal system of claim 9, the photovoltaic module and insulator forming at least a partial seal of the receiving aperture.

11. The concentrated solar photovoltaic and photothermal system of claim 1, further comprising a thermal energy storage unit connected to the thermoplate via the inlet port and outlet port.

12. A method for thermal heat generation, comprising:
   concentrating sunlight into concentrated solar light using the solar concentrator of the concentrated solar photovoltaic and photothermal system of claim 1;
   transmitting the concentrated solar light into the photovoltaic module of the concentrated solar photovoltaic and photothermal system;
   transmitting an infrared portion of the concentrated solar light that is unabsorbed by the photovoltaic module out of the photovoltaic module and through the receiving aperture formed by the thermoplate of the concentrated solar photovoltaic and photothermal system;
   converting, with the interior cavity of the thermoplate, the infrared portion passing through the receiving aperture into thermal energy;
   conducting the thermal energy from the interior cavity into heat-transfer fluid flowing through the structured channel formed by the thermoplate; and
   mixing, with the plurality of dimples of the thermoplate, the heat transfer fluid as it flows through the structured channel.

13. The method of claim 12, further comprising flowing the heat-transfer fluid into the structured channel via the inlet port.

14. The method of claim 12, further comprising flowing the heat-transfer fluid out of the structured channel via the outlet port.

15. The method of claim 12, further comprising steering the concentrated solar light onto the first side of the photovoltaic module.

16. The method of claim 12, further comprising thermally isolating the thermoplate from the photovoltaic module.

17. The method of claim 12, further comprising storing the thermal energy in a thermal energy storage unit.

18. The method of claim 12, wherein said converting includes converting the infrared portion using a high absorptivity surface treatment coating the interior cavity.

19. The method of claim 16, wherein said thermally isolating includes thermally isolating the thermoplate from the photovoltaic module using an insulator located between the thermoplate and the photovoltaic module.

\* \* \* \* \*